(12) United States Patent
Capodieci

(10) Patent No.: US 6,272,392 B1
(45) Date of Patent: Aug. 7, 2001

(54) METHODOLOGY FOR EXTRACTING EFFECTIVE LENS ABERRATIONS USING A NEURAL NETWORK

(75) Inventor: Luigi Capodieci, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/205,898

(22) Filed: Dec. 4, 1998

(51) Int. Cl.$^7$ ........................................... G06F 19/00
(52) U.S. Cl. ............................. 700/110; 700/120
(58) Field of Search ..................... 700/99, 104, 108, 700/110, 121, 120; 702/182; 716/4; 355/77, 71, 53, 55; 359/432

(56) References Cited

U.S. PATENT DOCUMENTS

| | | | |
|---|---|---|---|
| 4,906,081 | 3/1990 | Yasuda | 359/723 |
| 5,003,490 | 3/1991 | Castelaz et al. | 706/22 |
| 5,311,600 * | 5/1994 | Aghajan et al. | 382/156 |
| 5,348,837 | 9/1994 | Fukuda et al. | 430/269 |
| 5,450,352 | 9/1995 | Ftaclas et al. | 356/124.5 |
| 5,481,393 | 1/1996 | Kashima et al. | 359/227 |
| 5,610,684 | 3/1997 | Shiraishi | 355/55 |
| 5,646,870 * | 7/1997 | Krivokapic et al. | 716/4 |
| 5,677,757 | 10/1997 | Taniguchi et al. | 355/71 |
| 5,835,227 * | 11/1998 | Grodnensky et al. | 356/399 |
| 5,966,312 * | 10/1999 | Chen | 703/6 |
| 5,978,085 * | 11/1999 | Smith et al. | 356/521 |
| 6,115,108 * | 9/2000 | Capodieci | 355/77 |
| 6,130,173 * | 11/2000 | Esses | 438/932 |
| 6,154,711 * | 11/2000 | Steffan et al. | 702/82 |

OTHER PUBLICATIONS

"Zernike polynomials and atmospheric turbulence", Journal of the Optical Society of America, vol. 66, No. 3, Mar. 1976, pp. 207–211.

* cited by examiner

*Primary Examiner*—William Grant
*Assistant Examiner*—Chad Rapp
(74) *Attorney, Agent, or Firm*—Eschweiler & Associates, LLC

(57) ABSTRACT

A method (250) of extracting effective imaging system aberrations from test data collected from test structures (220) constructed from a lithography system having an imaging system associated therewith includes inputting (264) experimental critical dimension data corresponding to fabricated features (220) on a substrate (212) to a neural network (208). The method (250) also includes inputting (266) nominal critical dimension data corresponding to the fabricated features on the substrate (212) to the neural network (208) and determining (268) the effective aberrations of the imaging system associated with the lithography system used to fabricate the features (220) using the neural network (208).

16 Claims, 17 Drawing Sheets

METHODOLOGY FOR EXTRACTING EFFECTIVE LENS ABERRATIONS USING A NEURAL NETWORK

FIELD OF THE INVENTION

The present invention generally relates to photolithography, and more particularly relates to a system and method for characterizing an imaging system within a projection photolithography system and providing illumination compensation in response to such a characterization.

BACKGROUND OF THE INVENTION

Lithography in semiconductor processing relates generally to the process of transferring patterns which correspond to desired circuit components onto one or more thin films which overlie a substrate. One important step within the field of lithography involves optical tools and methods for transferring the patterns to the films which overlie the semiconductor wafer. Patterns are transferred to a film by imaging various circuit patterns onto a photoresist layer which overlies the film on the wafer. This imaging process is often referred to as "exposing" the photoresist layer. The benefit of the exposure process and subsequent processing allows for the generation of the desired patterns onto the film on the semiconductor wafer, as illustrated in prior art FIGS. 1a–1f.

Prior art FIG. 1a illustrates a photoresist layer 10 deposited by, for example, spin-coating, on a thin film 11 such as, for example, silicon dioxide ($SiO_2$) which overlies a substrate 12 such as silicon. The photoresist layer 10 is then selectively exposed to radiation 13 (e.g., ultraviolet (UV) light) via a photomask 14 (hereinafter referred to as a "mask") to generate one or more exposed regions 16 in the photoresist layer 10, as illustrated in prior art FIG. 1b. Depending on the type of photoresist material utilized for the photoresist layer 10, the exposed regions 16 become soluble or insoluble in a specific solvent which is subsequently applied across the wafer (this solvent is often referred to as a developer).

The exposed regions 16 are made either soluble or insoluble in the developer. When the exposed regions 16 are made soluble, a positive image of the mask 14 is produced in the photoresist layer 10, as illustrated in prior art FIG. 1c, and the photoresist material is therefore referred to as a "positive photoresist". The exposed underlying areas 18 in the film 11 may then be subjected to further processing (e.g., etching) to thereby transfer the desired pattern from the mask 14 to the film 11, as illustrated in prior art FIG. 1d (wherein the photoresist layer 10 has been removed). Conversely, when the exposed regions 16 are mode insoluble, a negative image of the mask 14 is produced in the photoresist 10 layer, as illustrated in prior art FIG. 1e, and the photoresist material is therefore referred to as a "negative photoresist". In a similar manner, the exposed underlying areas 20 in the film 11 may then be subjected to further processing (e.g., etching) to thereby transfer the desired pattern from the mask 14 to the film 11, as illustrated in prior art FIG. 1f.

The transfer of patterns to the photoresist layer 10 as discussed above involves the use of optical aligners. Optical aligners are machines which contain a variety of subsystems that work together to form the imaging function. Such optical aligners include: (1) an illumination source which provides the optical energy (UV light in the above example) for transforming the photoresist via exposure, (2) an optical subsystem that focuses the circuit patterns onto the photoresist surface and allows for controlled exposure times, and (3) and a movable stage that holds the wafer being exposed.

Historically, three primary methods have been used to optically transfer a mask pattern to a photoresist covered film. These methods are: contact printing, proximity printing and projection printing and are illustrated in simplified form in prior art FIGS. 2a–2d, respectively. Contact printing 100, as illustrated in prior art FIG. 2a, was the earliest method used to produce patterns. Contact printing 100 involves a light source 112, an optical system 114, a mask 116 and a photoresist layer 118 overlying a thin film 119 (not shown) which, in turn, overlies a semiconductor wafer 120. The mask 116, which contains the desired circuit patterns for transfer to the photoresist layer 118, is positioned (aligned) relative to any existing patterns that already existed on the wafer 120. The mask 116 is then clamped down to the photoresist layer 118, thereby making physical contact with the photoresist layer 118, and exposed with ultraviolet (UV) light from the light source 112. This method provides for an excellent image transfer and good resolution (i.e., good minimum linewidth spacing).

Contact printing, however, suffers from the direct contact made between the mask 116 and the photoresist layer 118. The repeated contact made between the mask 116 and the photoresist layer 118 in the process results in defects generated in the mask 116 which are then reflected in the transfer made on subsequently processed wafers. To prevent this problem, the masks 116 must be disadvantageously inspected and cleaned regularly. In addition, small particles may be caught between the mask 116 and the photoresist layer 118 when affixing the two elements, thereby preventing the desired direct contact between the mask 116 and the photoresist layer 118. This particulate contamination results in reduced resolution in the area local to the foreign particle. Consequently, contact printing is not common in VLSI semiconductor manufacturing.

Proximity printing 122, as illustrated in prior art FIG. 2b, involves placing the mask 116 near the wafer 120 (which is covered with the photoresist 118) during exposure, however, the mask 116 and the wafer 120 do not make contact. By introducing a gap 124 between the mask 116 and the wafer 120, the defect problem of contact printing is substantially avoided. Unfortunately, as the gap 124 increases, the resolution of the proximity printing system 122 rapidly deteriorates. For example, a 10 $\mu$m gap with a 400 nm exposure (the wavelength of the light source 112) results in a minimum resolution of about 3 $\mu$m. In addition, proximity printing 122 requires extremely flat masks 116 and wafers 120 in order to prevent gap variations spatially about the wafer 120. Since many VLSI semiconductor circuits today require features of 0.25 $\mu$m or less, proximity printing 122 is not considered adequate for many VLSI semiconductor manufacturing operations.

Projection printing is a generic term that encompasses various pattern transfer techniques. These techniques, for example, include: (a) projection scanning systems, (b) reduction (e.g., 4X or 10X) step-and-repeat projection systems and (c) reduction step-and-scan systems. In each system, lens elements or mirrors are used to focus the mask image on the wafer surface (containing the photoresist).

Projection scanning systems (often called scanning projection aligners), use a reflective spherical mirror (reflective optics) to project an image onto the wafer surface, as illustrated, for example, in prior art FIG. 2c. The system 126 includes a primary mirror 128 and a secondary mirror 129 which are arranged with the mask 116 and the wafer 120 to image the mask pattern onto the photoresist layer 118 which overlies the film 119 on the wafer 120 (the photoresist layer 118 and the thin film 119 are not shown in FIG. 2c for simplicity). A narrow arc of radiation is imaged from the mask 116 to the wafer 120 with light that travels an optical path that reflects the light multiple times. The mask 116 and the wafer 120 are scanned through the arc of radiation by means of a continuous scanning mechanism (not shown). The scanning technique minimizes mirror distortions and aberrations by keeping the imaging illumination in the "sweet spot" of the imaging system 128 and 129.

Reduction step-and-repeat systems 130 (also called reduction steppers) use refractive optics (as opposed to reflective optics in the system 126 of prior art FIG. 2c) to project the mask image onto the photoresist layer 118 which overlies the film 119 on the wafer 120, as illustrated, for example, in prior art FIG. 2d. The reduction stepper 130 includes a mirror 132, a light source 134, a filter 136, a condenser lens system 138, a reticle 140, a reduction lens system 142 and the wafer 120. The mirror 132 behaves as a collecting optics system to direct as much of the light from the light source 134 (e.g., a mercury-vapor lamp) to the wafer 120. The filter 136 is used to limit the light exposure wavelengths to the specified frequencies and bandwidth. The condenser system 138 focuses the radiation through the reticle 140 and to the reduction lens system 142 to thereby focus a "masked" radiation exposure onto a limited portion of the wafer 120, namely onto a single semiconductor die 144.

Since it is complex and expensive to produce a lens capable of projecting a mask pattern of an entire 150 mm or 200 mm wafer, the refractive system 130, as illustrated in prior art FIG. 2d, projects an image only onto a portion of the wafer 120 corresponding to an individual semiconductor die 144. This image is then stepped and repeated across the wafer 120 in order to transfer the pattern to the entire wafer (and thus the name "steppers"). Consequently, the size of the wafer is no longer a consideration for the system optics. In addition, the field of view may be scanned in order to utilize the center of the lens. These systems are referred to as step and scan systems.

The reduction stepper system 130 thus uses the reticle 140 instead of a mask. Reticles are similar to masks, but differ in that a mask contains a pattern for transfer to the entire wafer in one exposure while a reticle contains a pattern image for a single or several semiconductor die that must be stepped and repeated across the wafer 120 in order to expose the entire wafer substrate. In modern systems, however, the terms reticle and mask are used interchangably. Current reduction stepper systems such as the system 130 utilize reticles that contain a pattern that is an enlargement of the desired image on the wafer 120. Consequently, the reticle pattern is reduced when projected onto the wafer 120 during exposure (and thus the name "reduction stepper").

One advantage of stepper technology over the full wafer scanning type technology is higher image resolution (i.e., smaller minimum linewidths). In addition, stepping each die on the wafer 20 allows compensation for wafer distortion. Further still, reduction steppers provide good overlay accuracy. Steppers do, however, exhibit reduced throughput (number of wafers/hour) and require precision control of the mechanical stage (not shown) which holds the wafer 120. The advantages of reduction steppers, however, presently outweigh their disadvantages and thereby make reduction steppers quite popular in the manufacture of VLSI semiconductors with minimum linewidths less than 1 $\mu$m.

Although projection-type lithography systems provide good linewidth control, future generation lithography requires continuing improvements in linewidth, feature resolution, and critical dimension control both on a die-to-die basis and within a single die. Providing such advanced critical dimension control across a single die, however, is difficult because of a number of variations which may exist within the lithography system. For example, various types of aberrations may exist within an imaging system (primarily consisting of lens aberrations), which create corresponding critical dimension non-uniformities of features across the wafer. Detailed characterization information regarding such lens aberrations, however, is not provided by lithography system vendors; rather such imaging systems are merely guaranteed to meet a minimum imaging performance specification. Consequently, because lens characterization information is not known for a particular lithography system, the manner and extent to which critical dimension non-uniformities are manifest across a single die is also unknown.

Therefore there is a need in the art for a system and method of characterizing an imaging system within a projection photolithography system.

SUMMARY OF THE INVENTION

The present invention relates to a system and method for characterizing an imaging system within a projection-type photolithography system and providing compensation in response to such characterization to thereby improve critical dimension control across the image field.

According to one aspect of the present invention, a system and method for characterizing the imaging system includes use of a neural network or other type of intelligent or expert system. A plurality of experimental test features are formed at a plurality of points on a substrate using the imaging system to be characterized, which correspond to a plurality of points in the image field. The critical dimensions of the experimental test features are then measured for future processing.

In addition, a lithography simulator is utilized to characterize the deviation in the critical dimensions of simulated features from nominal feature critical dimensions for a variety of imaging system aberration conditions. The simulation data is saved and utilized as a training set to calibrate the neural network and thus establish a transfer function which maps a critical dimension variation for a feature from its nominal critical dimension to an effective imaging system aberration condition. Once trained, the neural network is used to characterize the imaging system using the experimental test feature critical dimension data at the plurality of points and the nominal feature critical dimension data associated therewith. Using such input data, the calibrated neural network identifies an effective imaging system aberration condition at various points in the image field which could produce the noted variation between the experimental and nominal feature critical dimensions.

According to another aspect of the present invention, a system and method of compensating for imaging system aberrations is provided to improve critical dimension uniformity across the image field. Imaging system characterization information is utilized in conjunction with a lithography simulator to identify a customized illumination scheme which compensates for the imaging system aberrations. An output of the lithography simulator representing simulated feature critical dimensions at points across the image field is compared to nominal feature critical dimension data associated with the points and an input illumination scheme for the lithography simulation is modified in response thereto.

Once the new illumination scheme is generated, another simulation is provided using the new illumination scheme, thus resulting in new simulated feature critical dimension data at the plurality of points. The comparison with the nominal feature critical dimension data and an illumination scheme modification in response thereto is continued until the difference between the simulated and nominal feature critical dimension data is approximately the same. The resulting custom illumination scheme associated therewith is then utilized in conjunction with the characterized imaging system to compensate for the imaging system aberration conditions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
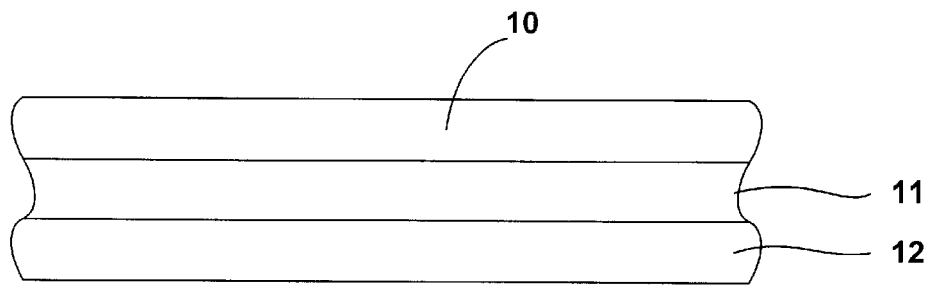
FIG. 1a is a fragmentary cross section illustrating a prior art semiconductor substrate having a film overlying the substrate which in turn is covered by a photoresist layer.
Figure 1B:
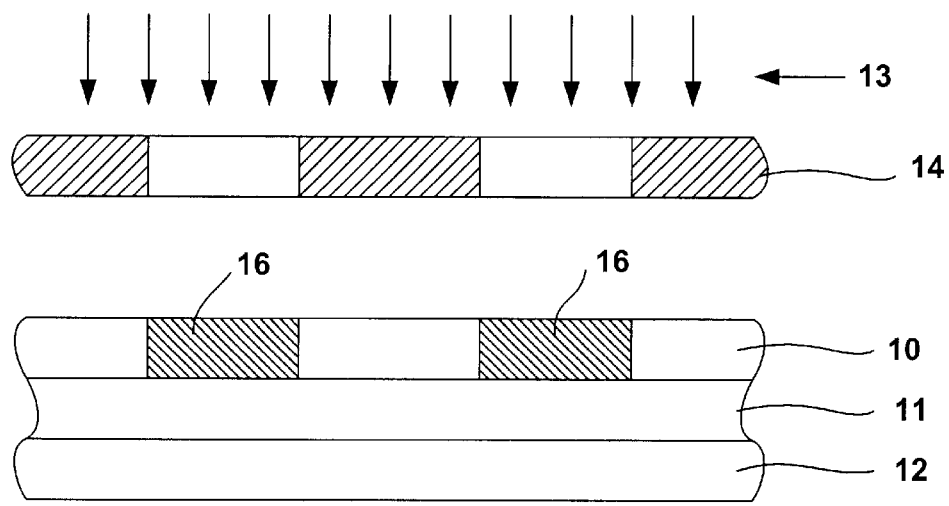
FIG. 1b is a fragmentary cross section illustrating a prior art method of selectively exposing a photoresist layer using a mask.
Figure 1C:
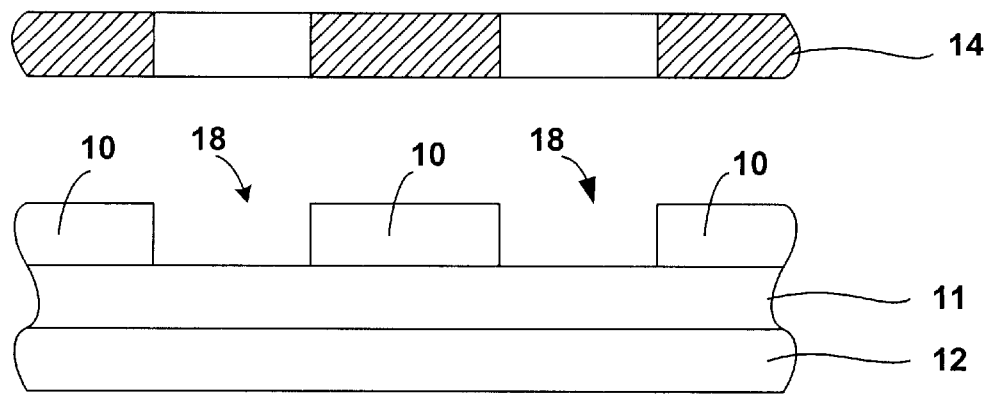
FIG. 1c is a fragmentary cross section illustrating a positive photoresist layer after being developed.
Figure 1D:
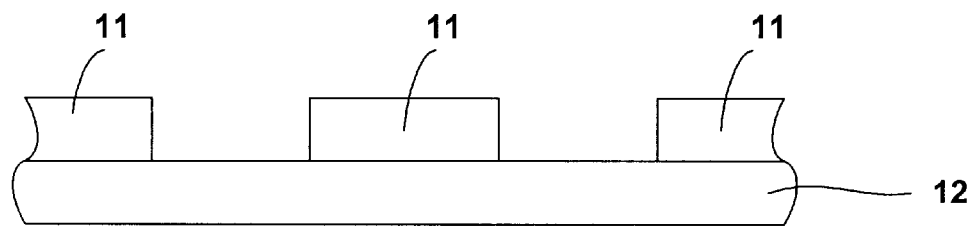
FIG. 1d is a fragmentary cross section illustrating a transfer of a mask pattern to the film.
Figure 1E:
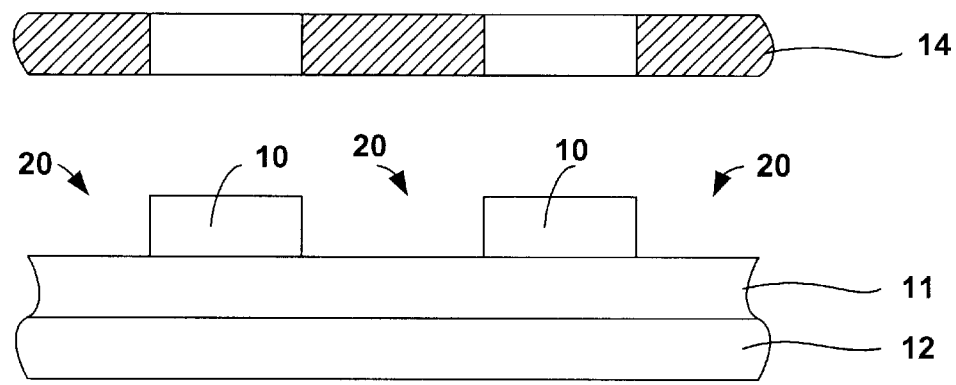
FIG. 1e is a fragmentary cross section illustrating a negative photoresist layer after being developed.
Figure 1F:
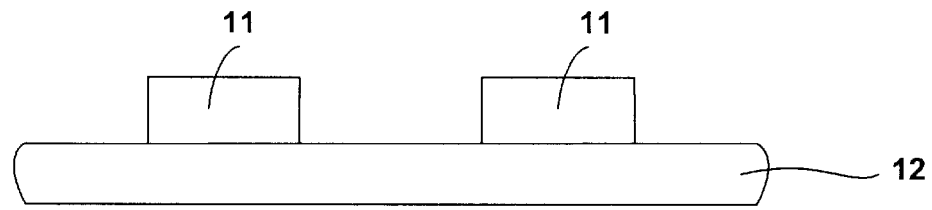
FIG. 1f is a fragmentary cross section illustrating a transfer of a mask pattern to the film.
Figure 2A:
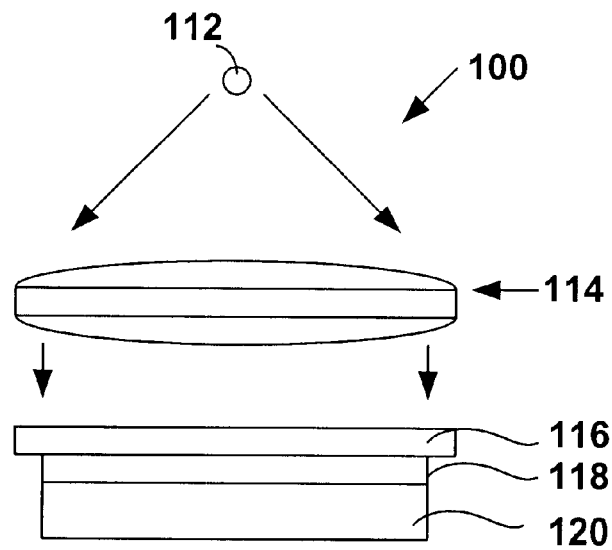
FIG. 2a is a cross section system view of a prior art contact printing system wherein a mask physically contacts the wafer during transfer of a pattern to the wafer.
Figure 2B:
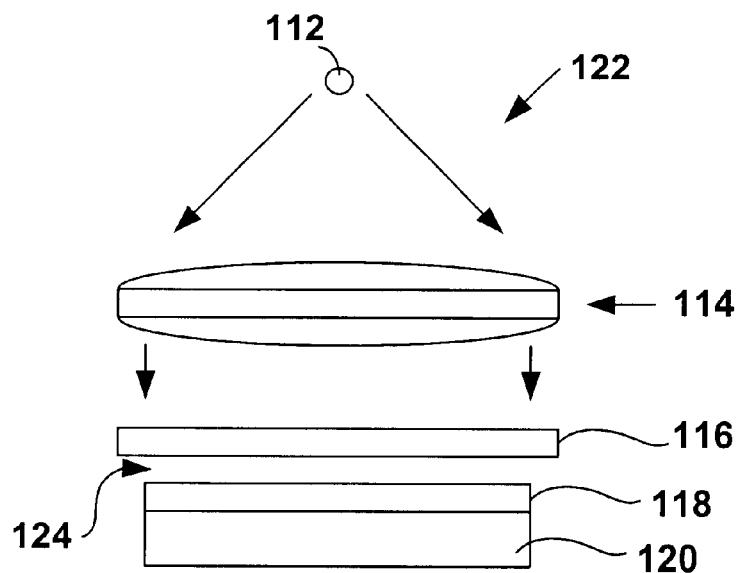
FIG. 2b is a cross section system view of a prior art proximity printing system wherein a mask is separated from the underlying wafer by a gap during transfer of a pattern to the wafer.
Figure 2C:
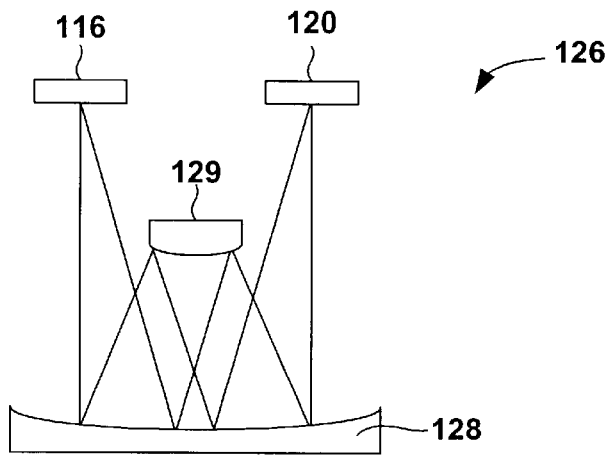
FIG. 2c is a cross section system view of a prior art scanning projection system wherein reflective optics are used to transfer a pattern to the wafer.
Figure 2D:
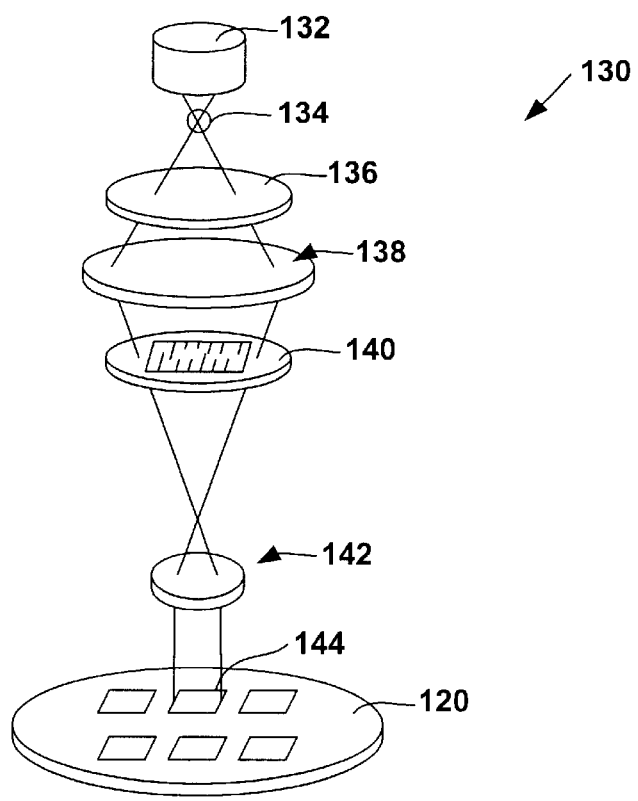
FIG. 2d is a perspective system view of a prior art projection-type reduction stepper wherein refractive optics are used to transfer a pattern to a localized region on the wafer.

The following is a detailed description of the present invention made in conjunction with the attached Figures, wherein like reference numerals will refer to like elements throughout. The present invention includes a system and method for characterizing an imaging system in a projection-type photolithography system. The characterization information is then used to generate a custom illumination scheme for use with the imaging system which compensates for aberrations therein and thus improves the critical dimension uniformity of features formed across a substrate which is processed with the characterized photolithography system.

According to one aspect of the present invention, a system and method is disclosed which characterizes an imaging system at a plurality of points in the image field. A plurality of experimental test features are formed on a substrate at a plurality of locations using the imaging system to be characterized, and the critical dimensions of the features are measured and stored as a set of experimental feature critical dimensions for the plurality of locations.

Separately, a number of lithography simulations are conducted by fixing the lithography processing conditions and a plurality of nominal simulation input features while varying the type of imaging system aberrations. The output lithography simulation data provides information regarding how the particular imaging system aberration condition causes a deviation in the critical dimensions of the simulated features from the intended nominal feature critical dimensions. This data is then used as a training set to calibrate a neutral network and thus establish a transfer function which maps an effective imaging system aberration condition to a given set of critical dimension data at a given point. After calibration, the neutral network is used to identify an effective imaging system aberration at a given point in the image field by analyzing the difference between the experimental test feature critical dimensions and the expected nominal feature critical dimension at that point.

According to another aspect of the present invention, imaging system characterization data is used to establish a custom illumination scheme which compensates for imaging system aberrations, thus providing increased feature critical dimension uniformity across a substrate. Preferably, an initial illumination scheme is used along with the imaging system characterization data to perform a lithography simulation, thus resulting in simulated feature critical dimension data at a plurality of points. The simulated feature critical dimension data is then analyzed and/or compared with the expected nominal feature critical dimensions at the plurality of points, an illumination scheme is modified in response to the comparison and another lithography simulation is run with the modified illumination scheme. The steps of analyzing the output data and modifying the illumination scheme in response thereto is repeated until the simulated feature critical dimensions are within an acceptable range of the expected nominal feature critical dimensions. The identified custom illumination scheme is then utilized in conjunction with the characterized imaging system to provide compensation for the aberrations within the imaging system and thus provides improved feature critical dimensions uniformity across the substrate.

Figure 3:
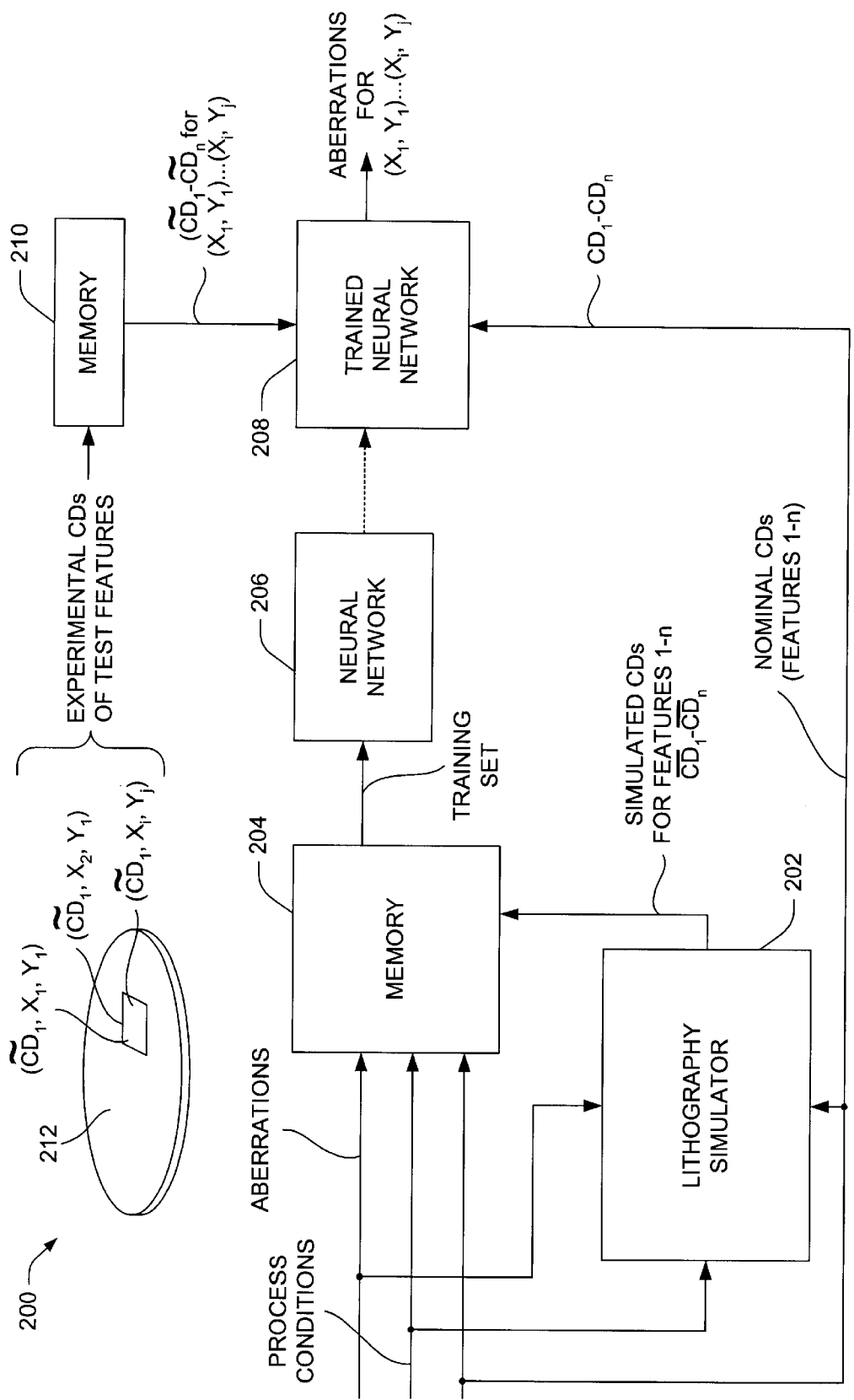
FIG. 3 is a block diagram illustrating a system for extracting effective imaging system aberration information from a lithography imaging system according to the present invention.

Turning now to the Figures, FIG. 3 is a system level block diagram illustrating a system 200 for characterizing an imaging system within a projection-type photolithography system. According to a preferred embodiment of the present invention, the imaging system includes a lens and a series of mirrors, etc. which aid in the imaging of a pattern residing on a photomask onto a substrate. Typically, the primary defects or aberrations in the imaging system are due to the lens and result in critical dimension non-uniformities across the imaged pattern on the substrate. The system 200 includes a lithography simulator 202 which may include, for example, a personal computer or workstation utilizing lithography simulation software such as Prolith/2 or Solid-C, manufactured by Finle Technologies, P.O. Box 162712, Austin, Tex. 78716 and Sigma-C, GmbH, Munich, Germany, respectively.

The lithography simulator 202 is operatively coupled to a memory 204 is store simulation data from the lithography simulator 202. The memory 204 may include a memory within a computer such as a RAM, a computer hard drive, or a centralized shared storage device; alternatively, the memory 204 may include a portable memory media such as a magnetic diskette or a tape, etc. Any memory structure capable of storing the lithography simulation data may be used and is contemplated at falling within the scope of the present invention. The system 200 of FIG. 3 further includes a neural network 206 which is operatively coupled to the memory 204. As will be described in greater detail infra, the neural network 206 uses the lithography simulation data within the memory 204 as a training set to calibrate the neural network 206 and thereby establish a calibrated neural network 208 having a transfer function which is operable to map a deviation between an experimental test feature critical dimension and a nominal feature critical dimension to an effective imaging system aberration which could have produced the variation.

Another memory 210 is operatively coupled to the calibrated neural network 208. The memory 210 contains experimental test feature critical dimension data for a plurality of points across a substrate 212 which was processed using the imaging system being characterized. The memory 210 may be separate from the memory 204 or alternatively may be integrated with the memory 204, as may be desired.

Figure 4:
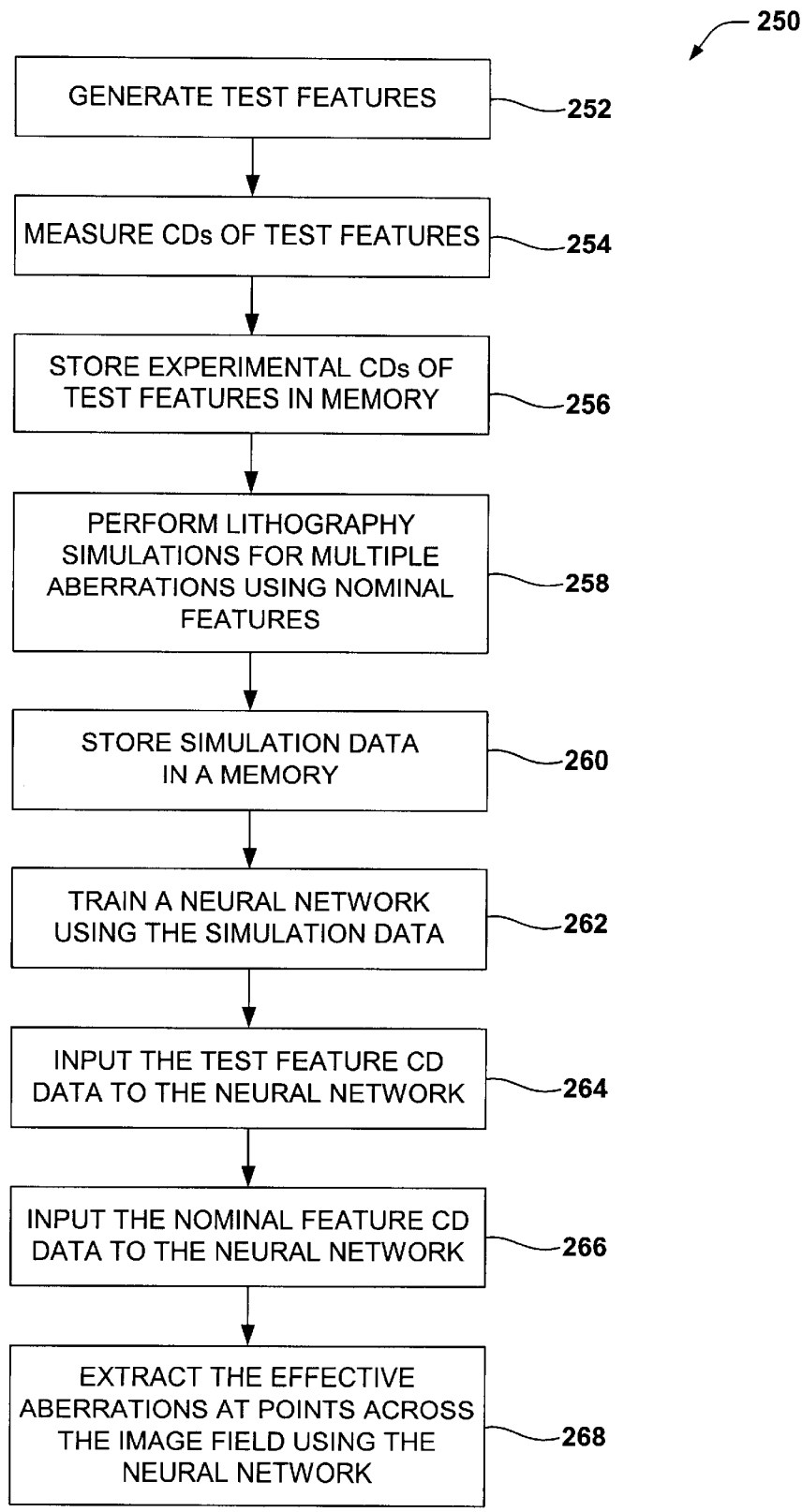
FIG. 4 is a flow chart diagram illustrating a method of extracting effective imaging system aberration information from a lithography imaging system according to the present invention.

A method 250 in which the imaging system characterization is effectuated is illustrated in FIG. 4 and the method 250 will be further explained in conjunction with FIGS. 3 and 5–11. The method 250 begins at Step 252 with the generation of a plurality of experimental test features across at least a portion of the substrate 212 (e.g., a die on the substrate 212) which corresponds with a plurality of points across the image field of the imaging system. The experimental test features are generated according to any number of conventional means. For example, the features may be an exposed a developed photoresist pattern or, alternatively, may be a patterned film such as doped polysilicon, a metal or an insulating-type film.

Preferably, the experimental test features consist of patterned, doped polysilicon which is conductive and thus is capable of being substantially measured using electrical linewidth measurement techniques. The experimental test features are preferably formed by depositing the polysilicon by, for example, chemical vapor deposition (CVD), and then doping the polysilicon by, for example, ion implantation to increase the conductivity of the polysilicon. A photoresist film is then formed over the polysilicon via, for example, spin-coating, and is then exposed and developed to expose portions of doped polysilicon underneath. The exposed polysilicon is then etched using, for example, a selected etching plasma chemistry to thereby form the experimental test features.

Figure 5:
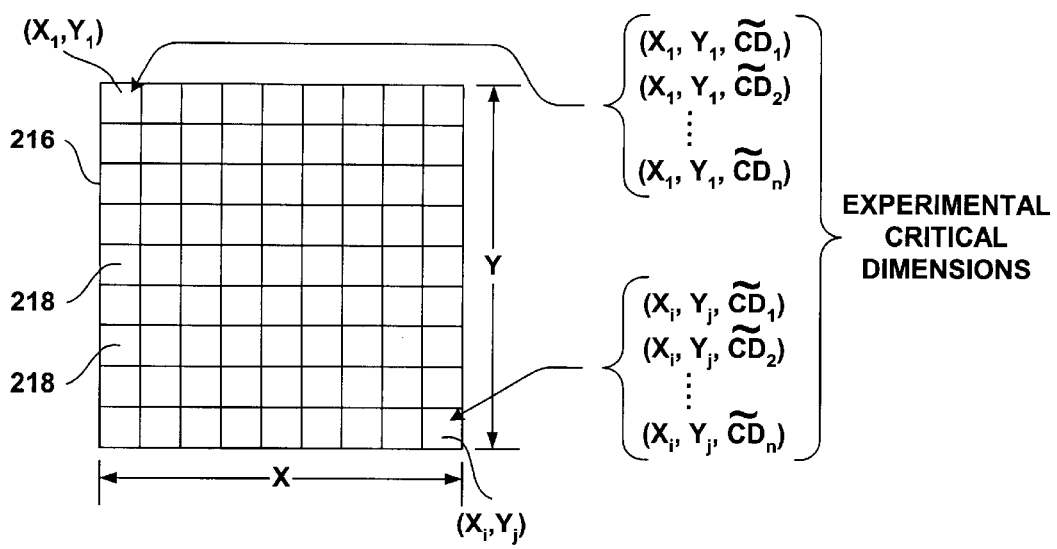
FIG. 5 is a plan view of a semiconductor die having a plurality of regions thereon, wherein each of the regions contain a plurality of experimental test features which are fabricated by the lithography system to be characterized.
Figure 6:
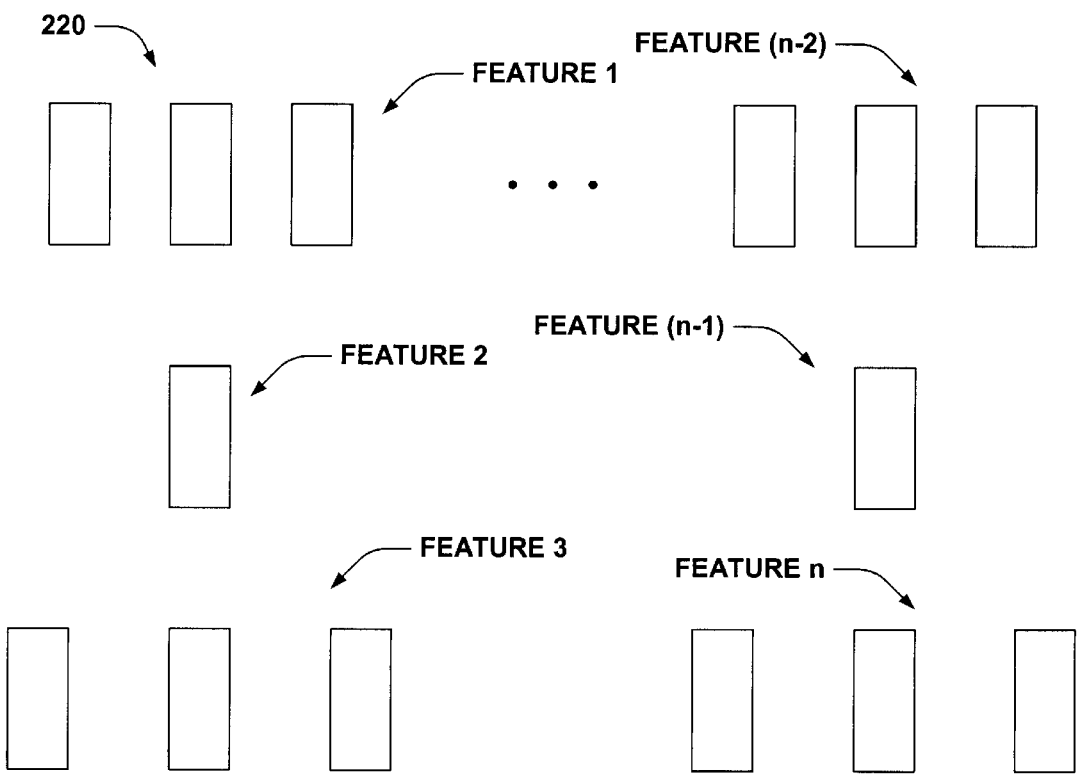
FIG. 6 is a plan view of the plurality of experimental test features of FIG. 5 according to an exemplary embodiment of the present invention.

Preferably, the experimental test features of interest are on a single die 216 in an array, as illustrated in FIGS. 5 and 6. The die 216 has a plurality of points 218, arranged in a grid and shown as points $(X_1, X_{Y1}), (X_2, Y_2), \ldots (X_1, Y_1)$ in FIG. 5. Each of the points 218 correspond to a point in the image field being characterized. According to a preferred embodiment of the present invention, a plurality of experimental test features are formed in each of the points 218, wherein each of the features will have critical dimensions (i.e., $\widetilde{CD}_1$, $\widetilde{CD}_2, \ldots \widetilde{CD}_n$, for "n" features at each point 218). Since various types of features exhibit different types of critical dimension variations from their nominal or expected critical dimensions for a given imaging system aberration condition, utilizing more than one type of feature at each point 218 is desirable and thus preferred to help more fully characterize the imaging system aberration at any given point in the image field.

An exemplary plurality of experimental test features 220 is illustrated in FIG. 6 As is well known by those skilled in the art, a "feature" is typically characterized using its nominal critical dimension and its line/space ratio with respect to neighboring structures. Consequently, a line having a 0.25 micron dimension exhibiting a 1:1 line/space ratio may appear as Feature 1 of FIG. 6 while another line exhibiting the same 0.25 micron dimension which is isolated from neighboring structures (such as Feature 2 of FIG. 6) is considered a different type of feature. Similarly, another structure having a line dimension of 0.25 micron with a line/space ratio of 1:2 (see FIG. 3 of FIG. 6) is considered yet another type of feature. Therefore for each point 218 on the die 216, a plurality of features 220 having differing dimensions and line/space ratios are preferably utilized to more fully and accurately characterize the aberration at a given point.

Returning now to FIG. 4, the method 250 continues at Step 254, wherein each of the experimental test features 220 are preferably measured at each of the plurality points 218. The measurement of the features may be accomplished via a variety of conventional methods such as with an electrical linewidth measurement (ELM) technique, optical techniques (e.g., laser, electron beam or ion beam measurements), use of the scanning electron microscope (SEM), etc. Preferably, however, ELM is used. Since "n" experimental test features exist at each point 218 of the 216, the critical dimension data at each point will be ($\overline{CD}_1$, $X_1$, $Y_1$), ($\overline{CD}_2, X_1$, $Y_1$). . . ($\overline{CD}_n$, $X_1, Y_1$). ($\overline{CD}_1, X_i, Y_j$), ( $\overline{CD}_2 X_i, Y_j$), . . . ($\overline{CD}_n$, $X_i, Y_j$)). Once the experimental test features are measured, the experimental test feature critical dimension data is stored in the memory 210 of FIG. 3 at Step 256.

Figure 7:
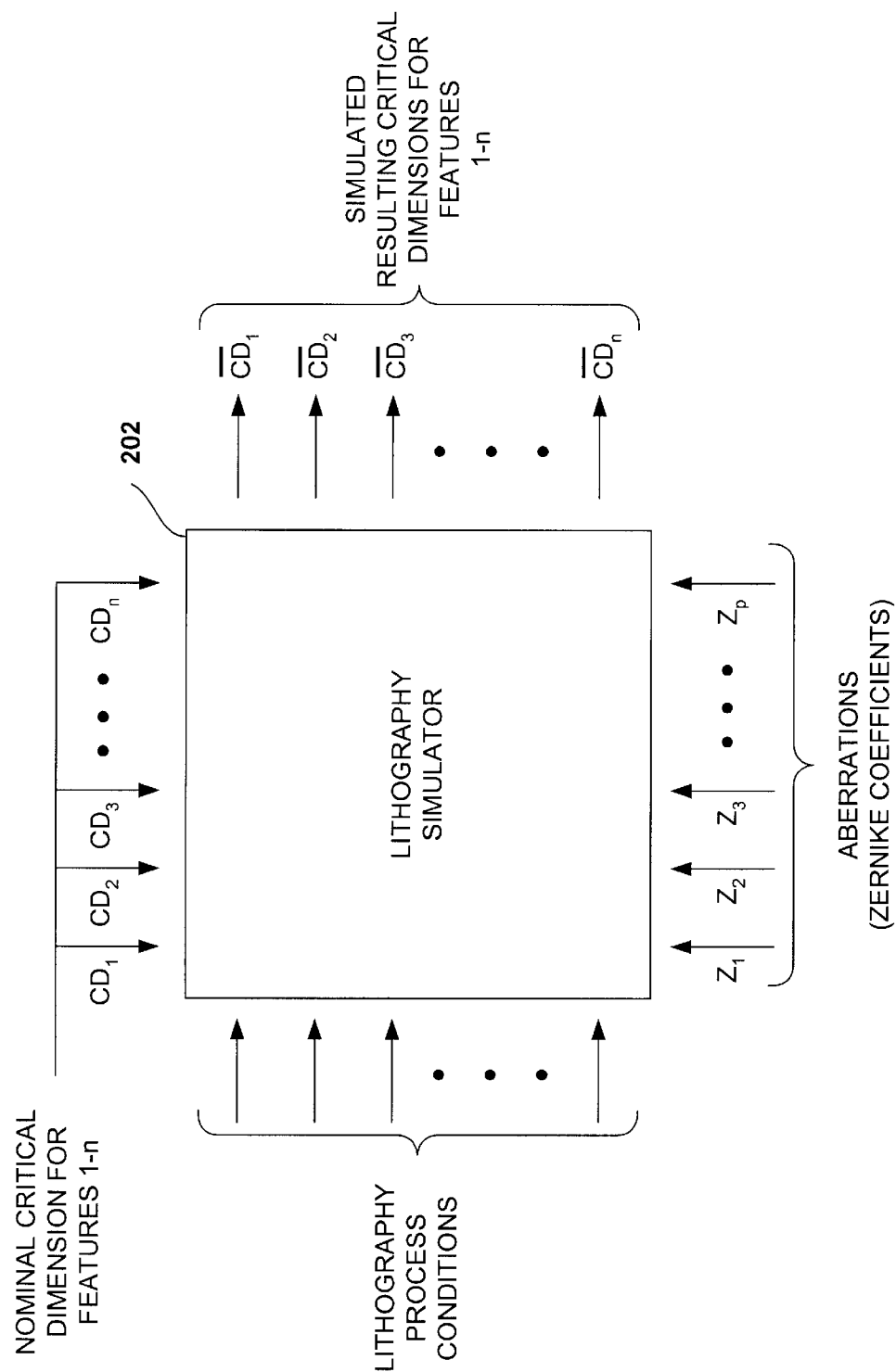
FIG. 7 is a block diagram illustrating a lithography simulator for simulating nominal features which correspond to the experimental test features of FIGS. 5 and 6 for a plurality of imaging system aberration conditions.

The method 250 continues at Step 258 by performing a plurality of lithography simulations, as illustrated in FIG. 7. Preferably, the lithography simulator 202 used to perform the lithography simulations is a lithography simulation software package such as Prolith/2 or Solid-C operated on a personal computer workstation, however, other lithography simulation software or other type simulation techniques may be utilized and any such alternative methods and techniques are contemplated as falling within the scope of the present invention. In performing the lithography simulations, it is preferred that a given set of lithography process conditions (e.g., illumination dose, focus, equipment setup data, etc.) be fixed at the processing conditions which were used in the generation of the experimental test features at Step 252. According to an exemplary embodiment of the present invention, a dose is about 12 mJ/cm$^2$, a focus is 0 (e.g., best focus), a resist thickness is 0.75 micron, and a post-exposure back is 100° C. for 110 seconds, etc.

In addition, the lithography simulator 202 utilizes, as inputs, nominal feature critical dimension data for a plurality of nominal features including the linewidth dimension and line/space ratio. The nominal features of the simulation Step 258 correspond to the intended feature critical dimensions of the experimental test features at a single point 218 that were generated in Step 252. Then, for the given lithography process conditions and the specified nominal features, an imaging system aberration condition is provided which reflects a potential aberration which may exist within the imaging system. Such an aberration condition is preferably characterized as a set of Zerniike coefficients ($Z_1, Z_2, \ldots Z_p$) for a polynomial. As is well known by those skilled in the art, Zernike polynomials are circle polynomials which may be used to describe the aberrations of an optical system. Such polynomials may be classified as standard polynomials or as so-called Fringe code, as may be desired. The output of the lithography simulation that is run for the given imaging system aberration condition (along with the input data) is saved in the memory 204 at Step 260. The simulation output consists of simulated feature critical dimensions ($\overline{CD}_1$, $\overline{CD}_2, \ldots \overline{CD}_n$), which correspond to the input nominal features ($CD_1, CD_2, \ldots CD_n$). Note that some or all of the critical dimensions of the simulated output features will vary from the critical dimensions of the intended nominal features due to the imaging system aberration condition (e.g., $\overline{CD}_1 = CD, \pm \Delta CD_1$).

Once the lithography simulation is completed for a first imaging system aberration condition, another aberration condition is input to the lithography simulator (e.g., a different set of Zernike coefficients), another simulation is run and the output data (along with its input data) is saved in the memory 204. This process (Steps 258 and 260) is preferably repeated until all of the different imaging system aberration conditions have been simulated. One exemplary way of accomplishing the above steps is as follows. If each imaging system aberration condition is expressed as a polynomial having "P" Zernike coefficients, and each coefficient can take on one of "Q" different values, then the total number of potential imaging system aberration conditions is equal to P×Q. Therefore, the P×Q different imaging system aberration conditions are preferably used to perform P×Q lithography simulations (Step 258), each of which has its data saved (Step 260) in order to have sufficient data to fully identify the various imaging system aberrations, as will be discussed in greater detail infra.

Figure 8:
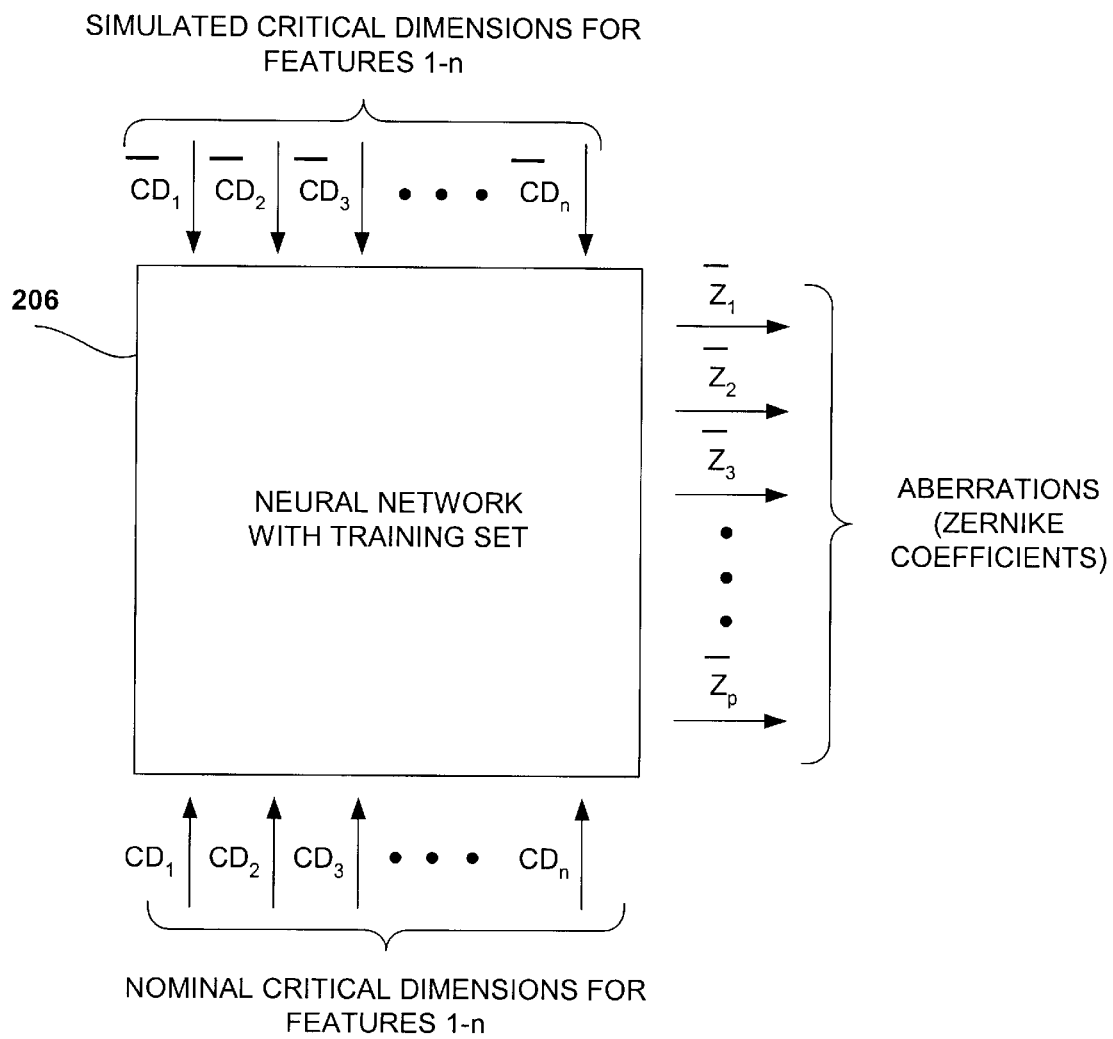
FIG. 8 is a block diagram illustrating a training or calibration of a neural network using a training set according to the present invention.
Figure 9:
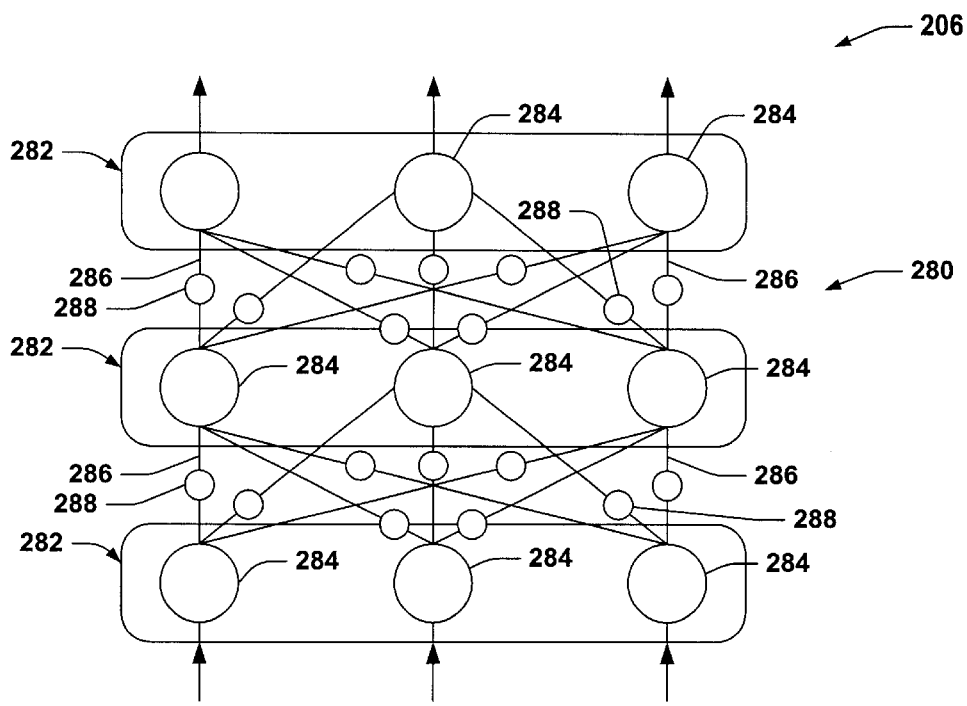
FIG. 9 is a schematic diagram illustrating a simplified, exemplary neural network for use in extracting effective aberrations of a lithography imaging system according to the present invention.
Figure 10:
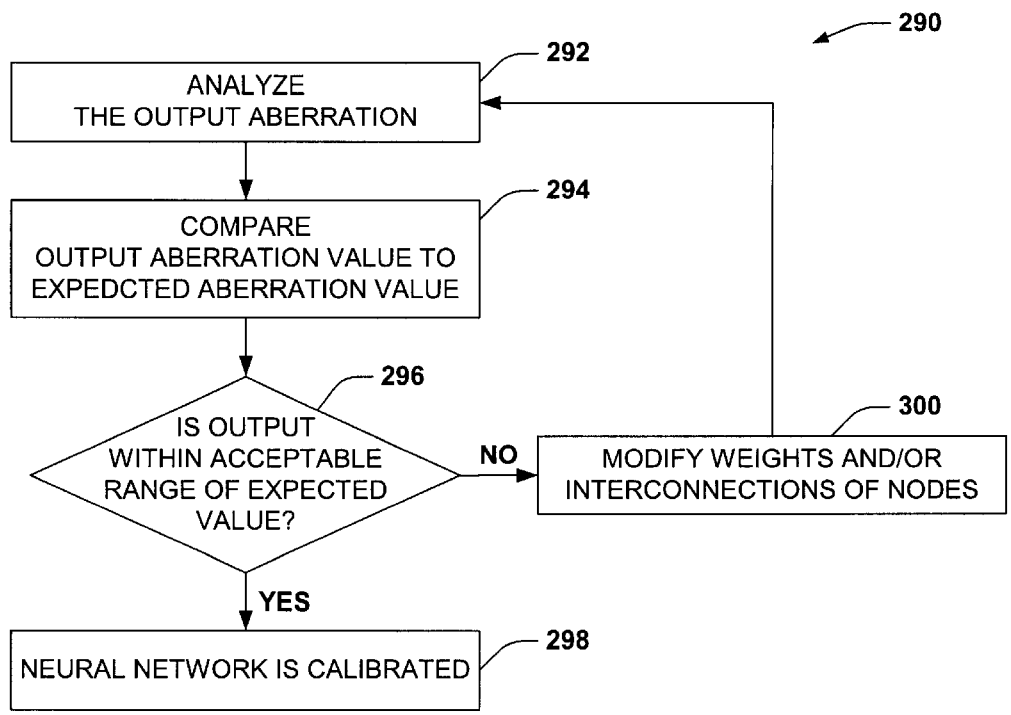
FIG. 10 is a flow chart diagram illustrating a method of training or calibrating the neural network using a training set according to the present invention.

The simulation data in the memory 204 is then used as a training set to calibrate the neural network 206 at Step 262, as illustrated in FIGS. 4 and 8–9. As illustrated in FIG. 8, the neural network 206 is configured to receive, as an input vector, the critical dimensions of the nominal features ($CD_1$, $CD_2, \ldots CD_n$) and the critical dimensions of the simulated features ($\overline{CD}_1, \overline{CD}_2, \ldots \overline{CD}_n$) and provide an output vector which represents the imaging system aberration condition which produces the variations between the intended nominal features and the simulated features (e.g., a set of Zernike coefficients, $\overline{Z}_1, \overline{Z}_2, \ldots \overline{Z}_p$). One manner in which the neural network 206 may be trained will be discussed in conjunction with FIGS. 9 and 10.

FIG. 9 is an exemplary illustration of the neural network 206 arranged as a multi-layer perceptron 280. The perceptron 280 includes a plurality of layers 282 having neurons 284 which, in hardware arrangements, may constitute individual processors such as an op-amp, etc. and, in software arrangements, may constitute algorithmic connection nodes. Each neuron 284 which preferably produces an output which is a predetermined function of its inputs. While only three neurons are shown in each layer 282 in FIG. 9, it should be understood that any number of neurons 284 may be employed depending on the number of features at a given point. In addition, the number of layers 282 may also vary, as may be desired or needed. Each neuron 284 within each layer 282 is preferably connected to each neuron of each adjacent layer.

Each of the connections 286 between the neurons 284 contain weights or synapses 288. The synapses 288 may be implemented in hardware implementations via variable resistances or amplifiers having variable gains or may, in software implementations, simply include fractional weights for modifying a neuron function. The synapses 288 serve to reduce or increase the strength of the connection between the neurons 284. The value of the connection strengths of each synapse 288 may vary from some predetermined maximum value (typically "1") to zero. When the weight is zero there is, in effect, no connection between the neurons 284.

The process of training or calibrating the neural network 206 involves adjusting the connection strengths of each synapse 288 in a repetitive fashion until a desired output vector is produced in response to a particular input vector. In particular, the training of the neural network 206 will have the strength of the synapses 288 adjusted to produce an output reflecting the imaging system aberration condition (Zernike coefficients) associated with the inputs which reflect the deviation between the nominal feature critical dimensions and the simulated feature critical dimensions. Since the training set knows what aberration condition is associated with the input data (due to the earlier simulations), the neural network output is compared to the expected output and the weighting values of the synapses 288 are modified in response thereto. This process is then reiterated multiple times till the neural network output is within an acceptable range of the expected output (e.g., about ±5% or less), as illustrated in a training method 290 of FIG. 10.

Typically such a training procedure 290 analyzes the output aberration (Step 292) (e.g., Zernike coefficients associated with the simulations which produced such critical dimension variations, $Z_1, Z_2, \ldots Z_p$) and compares the output from the expected output (Step 294) and based upon the difference between the two (Step 296), either the procedure ends and the neural network 206 is calibrated (Step 298) or an error signal is produced which is used in accordance with a training algorithm to adjust the weights of the various synapses 288 to reduce the value of the subsequent output error (Step 300). A multitude of different training algorithm techniques may be utilized and any such technique is contemplated as falling within the scope of the present invention. For example, a back propagation training algorithm or a Levenberg-Marquardt algorithm may be utilized. Please note, however, that numerous different training algorithms exist and any such training algorithm is contemplated as falling within the scope of the present invention.

According to a preferred embodiment of the present invention, a neural network 206 is calibrated using a training set to form a neural network 208 having a transfer function which maps deviations from nominal feature critical dimension data to an effective imaging system aberration condition which could have generated the noted deviation. A neural network is the preferred mechanism for determining such aberrations because it is not necessary for an individual who is training the neural network to fully understand all the physical and/or optical mechanisms which dictate how various aberrations impact the critical dimension uniformity for various types of features. Alternatively, however, because the physical and/or optical mechanisms are understood, as evidenced by the lithography simulator 202, an expert system may alternatively be utilized which incorporates the physics and optics principles of lithography as a set of rules which are applied to the provided input data to determine an effective imaging system aberration condition associated with the deviations of the critical dimensions of various features from their intended nominal values. Therefore use of such an expert system or other form of intelligent system is also contemplated as falling with the scope of the present invention.

Figure 11:
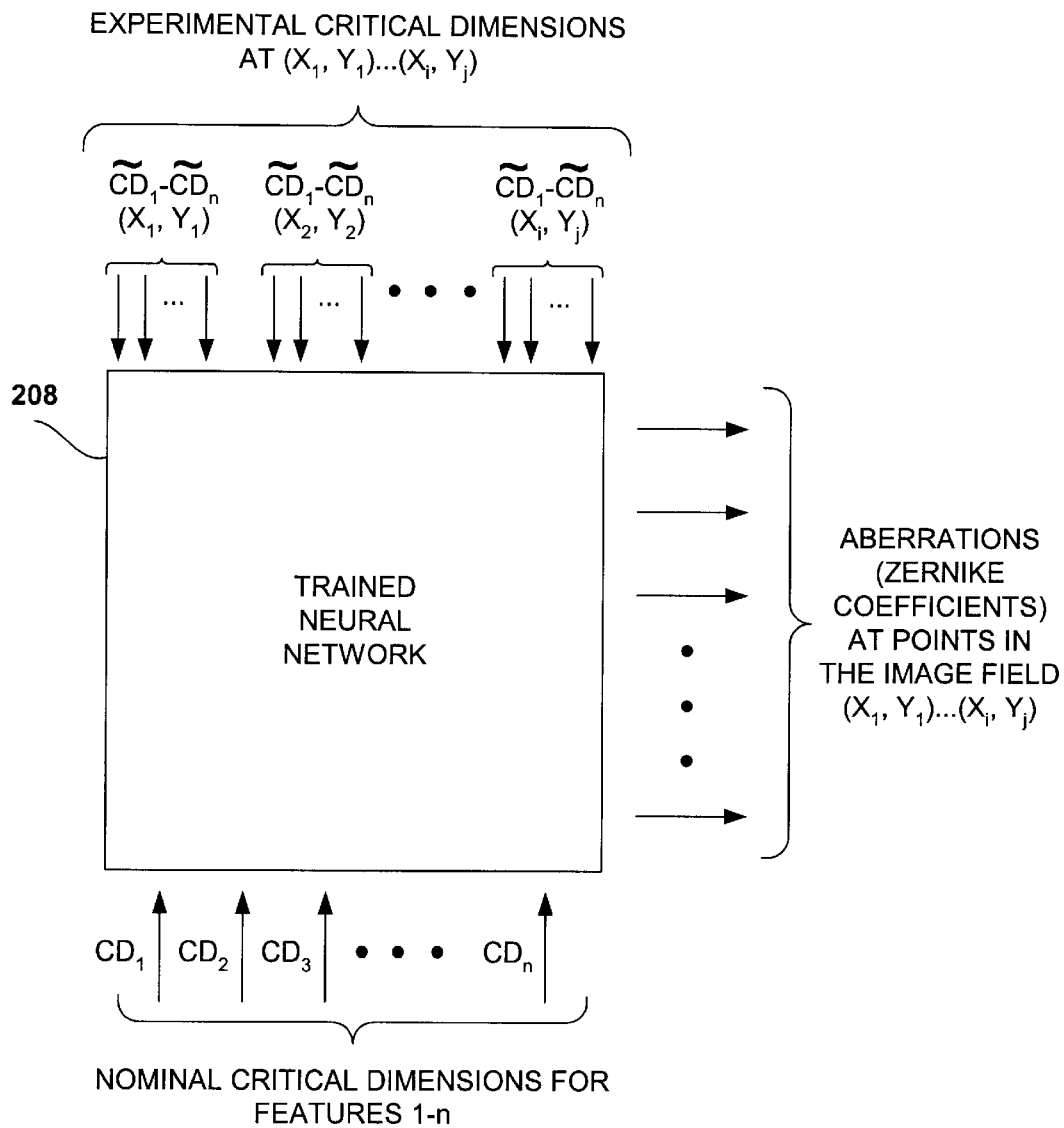
FIG. 11 is a block diagram illustrating use of a trained or calibrated neural network using the experimental test feature critical dimension data and nominal feature critical dimension data to determine effective aberration conditions of the imaging system at various points according to the present invention.

Returning now to FIG. 4, the method 250 continues and the trained or calibrated neural network 208 is utilized at Step 264, by inputting the experimental test feature critical dimension data from the memory 210, as illustrated in FIG. 11. Note that the experimental test feature data critical dimension data includes the critical dimensions for various features ($\overline{CD}_1, \overline{CD}_2, \ldots \overline{CD}_n$) for a plurality of different points across the substrate 212 $((X_1,Y_1),(X_2,Y_1)\ldots(X_i,Y_j))$. Likewise, the method 250 includes inputting the nominal critical dimension data for each of the features at Step 266. Since the nominal features are intended to be uniform at each point across the substrate, only one set of nominal feature critical dimension data needs to be input to the neural network 208.

Recall that the neural network 208 has been calibrated to determine or "extract" an effective imaging system aberration condition given a deviation between two pieces of critical dimension data (i.e., the experimental and nominal feature critical dimension data). Therefore the neural network 208 outputs imaging system aberration conditions (preferably in the form of Zernike coefficients) for the various deviations for the various points 218. Because the imaging system aberrations may differ across the image field, the deviations in the experimental test feature critical dimension data from the nominal feature critical dimension data also may differ at the various points 218 across the substrate 212. Consequently, the output imaging system aberration conditions $(Z_1, Z_2, \ldots Z_p)$ differ for each point 218. (e.g., $((Z_1,X_1,Y_1),(Z_2,X_1,Y_1) \ldots (Z_p,X_1,Y_1); (Z_1,X_2,Y_1) (Z_2,X_2,Y_1), \ldots (Z_1,X_1,Y_1); \ldots (Z_1,X_1,Y_j),(Z_1,X_1,Y_1), \ldots (Z_p,X_1,Y_1)))$.

Figure 12:
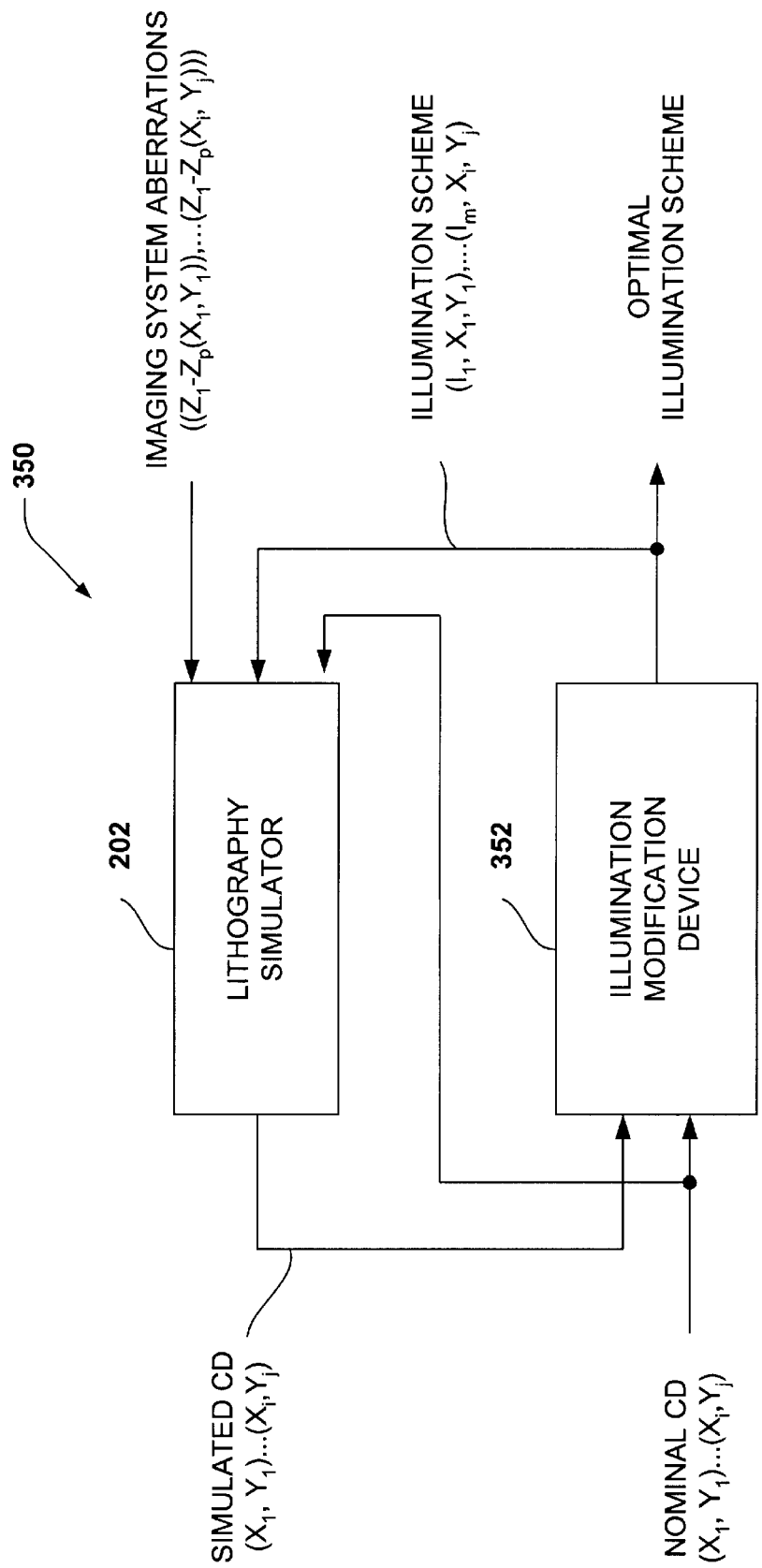
FIG. 12 is a block diagram illustrating a system for generating a customized illumination scheme to compensate for aberrations associated with a lithography imaging system according to the present invention.

Thus, as seen above, the system 200 and the method 250 provide for a characterization of the imaging system at each point 218 which corresponds to the entire image field. The above imaging system characterization data may then be used in a lithography compensation system 350 to provide compensation (e.g., illumination compensation) to the projection-type photolithography system which was characterized as discussed above, or via any other characterization method and thus improve the uniformity of the critical dimensions of features, as illustrated in FIG. 12. The compensation system 350 includes the lithography simulator 202 and an illumination modification device 352 which are operatively coupled together.

Figure 13:
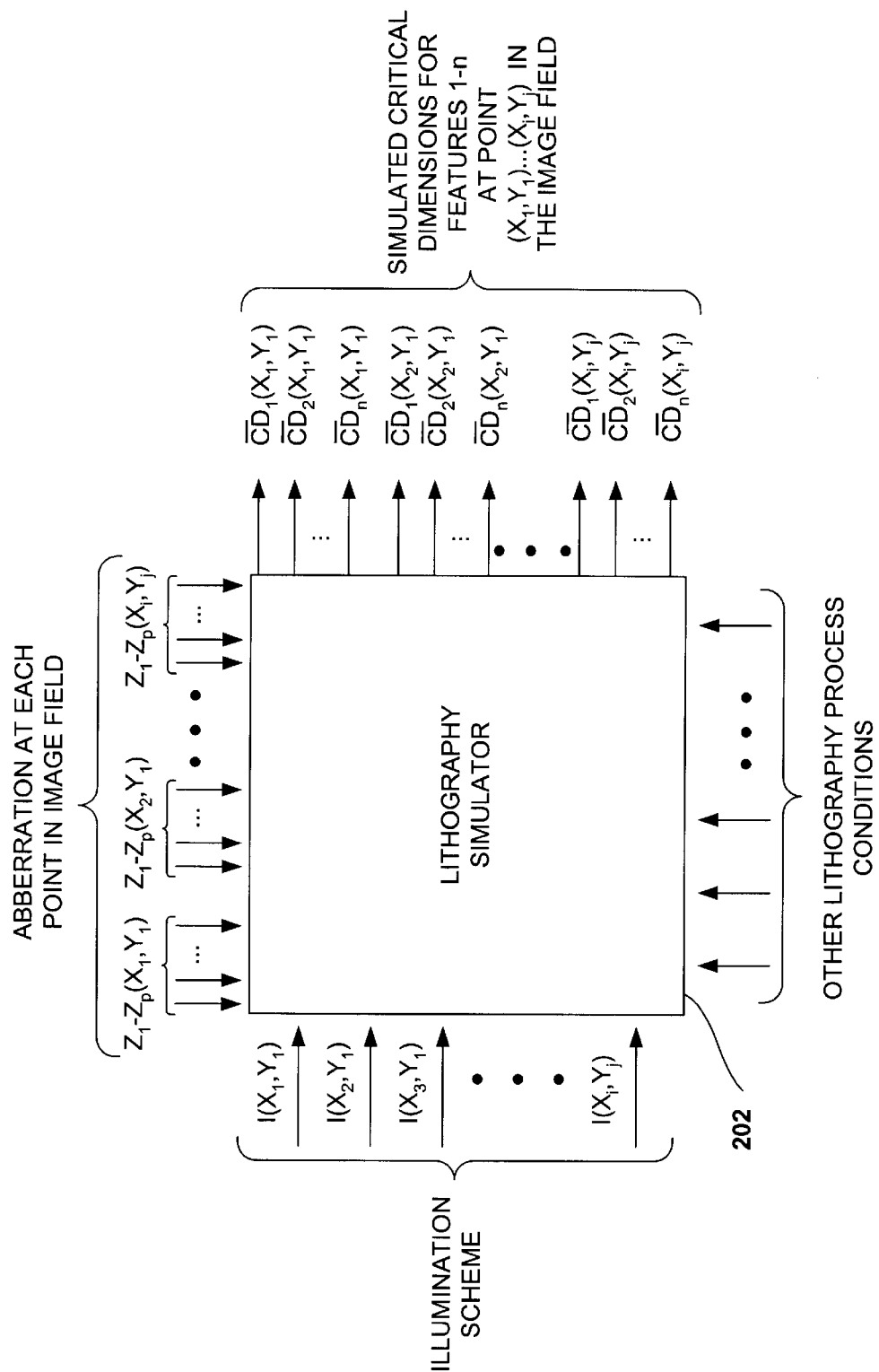
FIG. 13 is a block diagram illustrating a lithography simulator according to the present invention.

As discussed supra, the lithography simulator 202, as illustrated in FIGS. 12 and 13, is operable to simulate lithography processing for a given set of processing conditions, imaging system aberration conditions, nominal feature critical dimension data, and an illumination scheme; and further is operable to output simulated feature critical dimension data associated with the input conditions. The illumination modification device 352 according to a preferred embodiment of the present invention is operable to compare the simulated feature critical dimension data to the nominal feature critical dimension data and modify one or more portions of the illumination scheme in response to the comparison, as will be described in greater detail infra.

Figure 14:
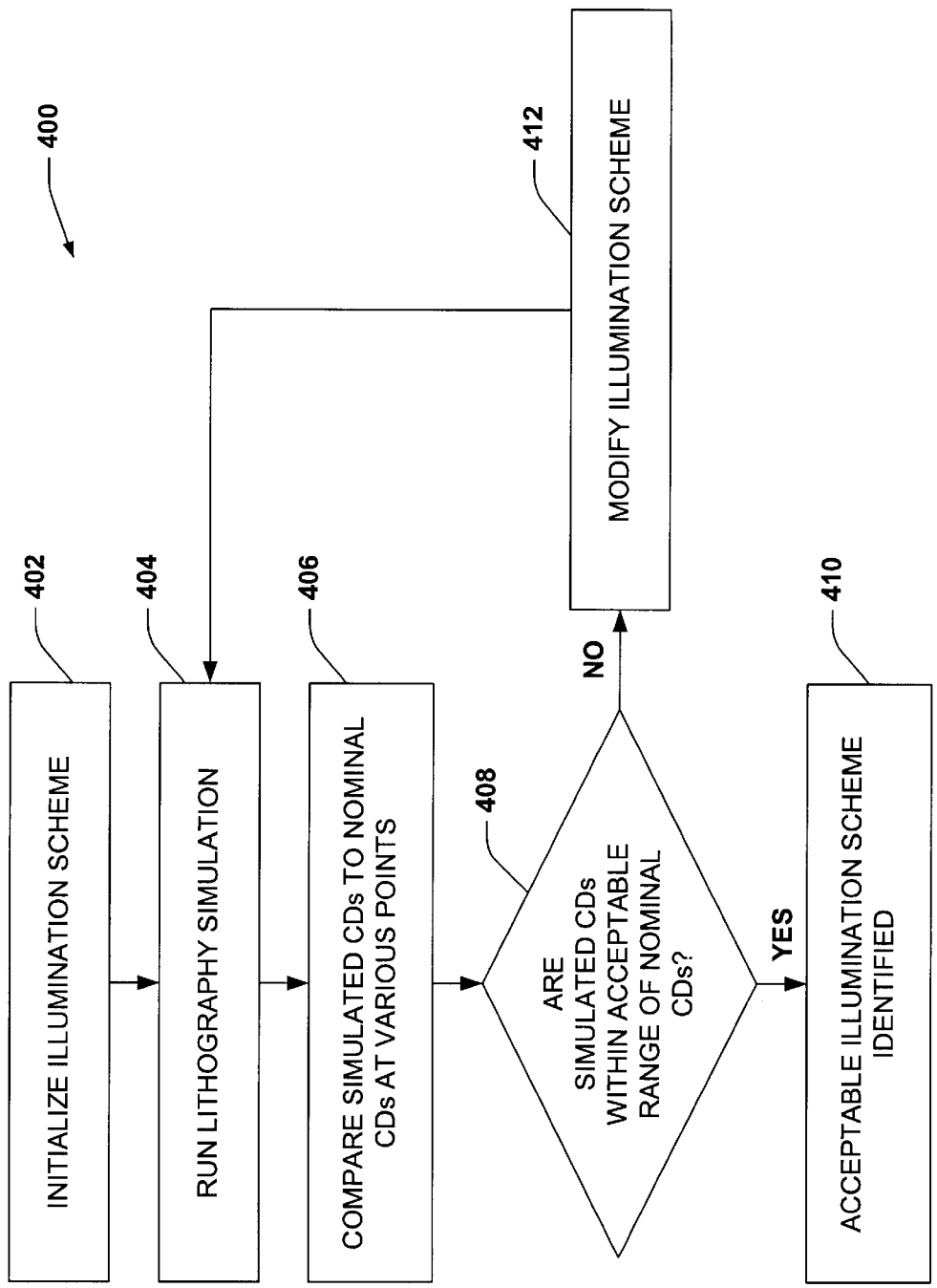
FIG. 14 is a flow chart diagram illustrating a method of generating a customized illumination scheme to compensate for aberrations associated with a lithography imaging system according to the present invention.

A method 400 for identifying an illumination compensation scheme for a characterized imaging system is illustrated in FIG. 14. The method 400 includes initializing the illumination scheme to an initial value, for example, a uniform illumination scheme, at step 402. Alternatively, other initial illumination schemes may be used as initial starting points as may be desired.

The method 400 continues at step 404, wherein a lithography simulation is run using the lithography simulator 202. The lithography simulator 202 preferably uses fixed lithography process conditions associated with how a projection-type lithography system will be run in production (e.g., dose, focus, equipment set-up, etc.) and also utilizes as another input the characterization data associated with the imaging system. For example, as discussed supra, the system 200 of FIG. 3 may be used to characterize an imaging system and provide aberration characterization data in the form of Zernike coefficients. Alternatively, however, other forms of characterization data may be utilized and are contemplated as falling within the scope of the present invention. In addition, the input data to the simulator 202 further includes the nominal feature critical dimension data and the initial illumination scheme. Using the above input data, the lithography simulator 202 provides an output containing simulated feature critical dimension data that varies from the nominal feature critical dimension data at one or more points due to the input imaging system aberrations (e.g., $\overline{CD}_1(X_1, Y_1)$, $\overline{CD}_2(X_1, Y_1)$, ...$\overline{CD}_n(X_1...Y_1)$; ... $\overline{CD}_1(X_1, Y_1)$, $\overline{CD}_2(X_1, Y_j)$, .... ($\overline{CD}_n(X_i, Y_j)$), as illustrated in FIG. 13.

At step 406, the illumination modification device 352 compares the simulated feature critical dimension data at the plurality of points 218 to the nominal feature critical dimension data. Preferably, the comparison is conducted one point 218 at a time (e.g., $(X_1, Y_1)$, then $(X_2, Y_1)$, etc.), however, the comparison of step 406 may alternatively be performed for a plurality of points in parallel. If the simulated feature critical dimension data is within an acceptable range of the nominal feature critical dimension at that point at step 408 (YES), an acceptable illumination scheme for that point in the image field (e.g., $I(X_i, Y_j)$) has been established at step 410 and no further modifications to the illumination scheme is performed for that particular point. If, however, the simulated feature critical dimensions at that point are not within an acceptable range of the nominal feature critical dimensions at step 408 (NO), the illumination scheme is then modified at that point at step 412.

The manner in which the illumination scheme is altered may vary. According to one exemplary embodiment of the present invention, the illumination scheme may be varied randomly to another, differing illumination scheme. Such a variation may include, for example, changing the illumination intensity, phase or coherency (or a combination thereof) of the illumination radiation. Alternatively, the simulated feature critical dimension data may be analyzed using one or more sets of rules which are based on the dependence of the critical dimensions of features on the illumination, and then identifies an illumination scheme modification to compensate for the imaging system aberration condition at that point Use of such an expert rules set (e.g., if-then-else rules) is contemplated as falling within the scope of the present invention.

After the illumination scheme is modified at step 412, another simulation is run at step 404 using the modified illumination scheme as a portion of the input data. The steps of analyzing the output data, determining whether additional illumination scheme modifications are necessary and making any such modifications (steps 406, 408 and 412) are continued until an acceptable illumination scheme is established for each of the points 218 corresponding to the various points in the image field. Once each point has an acceptable illumination scheme, the method 400 is complete, and the illumination scheme modification device 352 of FIG. 12, which preferably was being modified in software, can be constructed in hardware for utilization in the lithography system employing the imaging system which was characterized. In this manner, the non-uniformities in the critical dimensions of various features due to the imaging system aberrations are substantially reduced.

Figure 15:
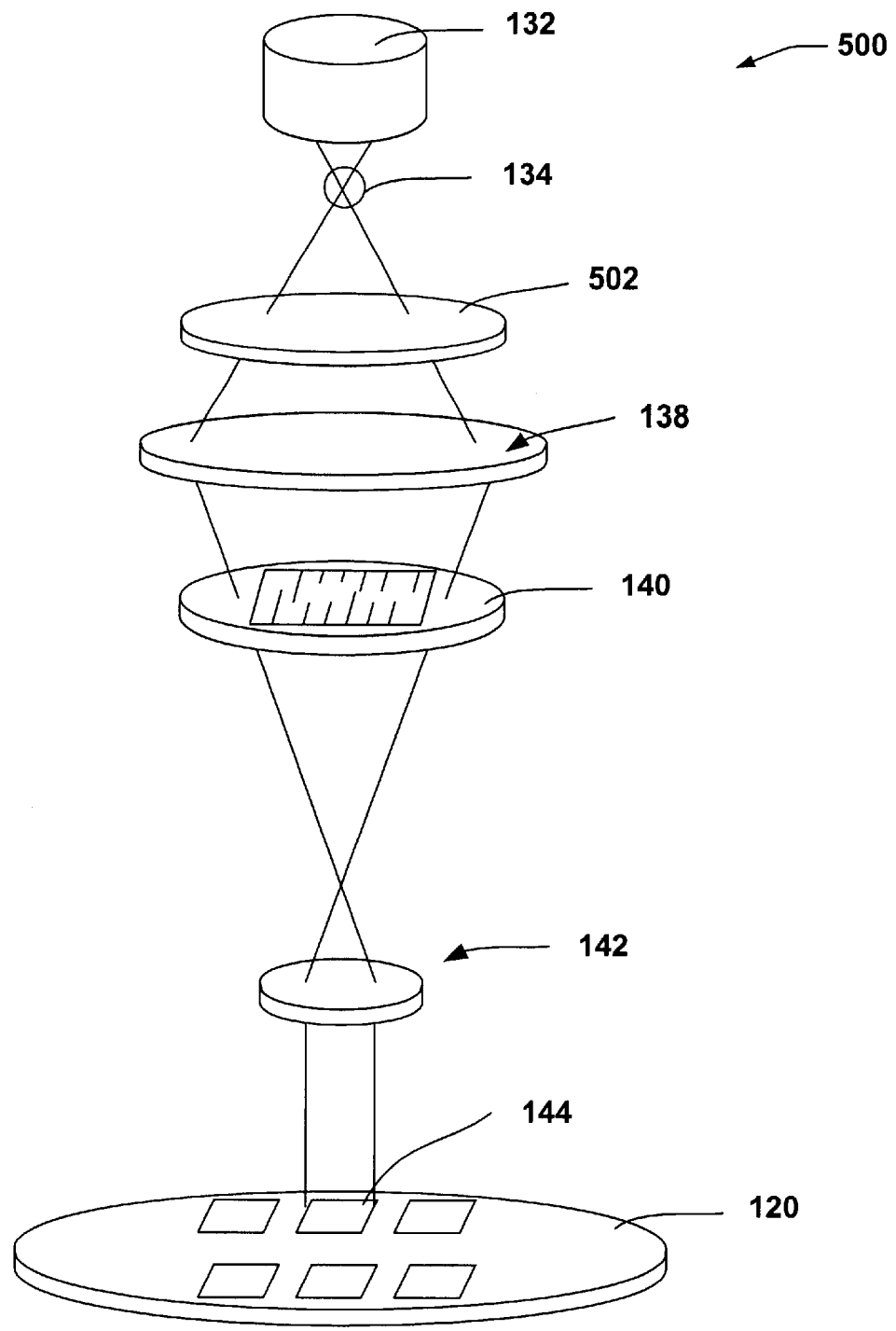
FIG. 15 is a perspective view of an exemplary projection-type lithography system having an illumination scheme modification device according to the present invention.
Figure 16:
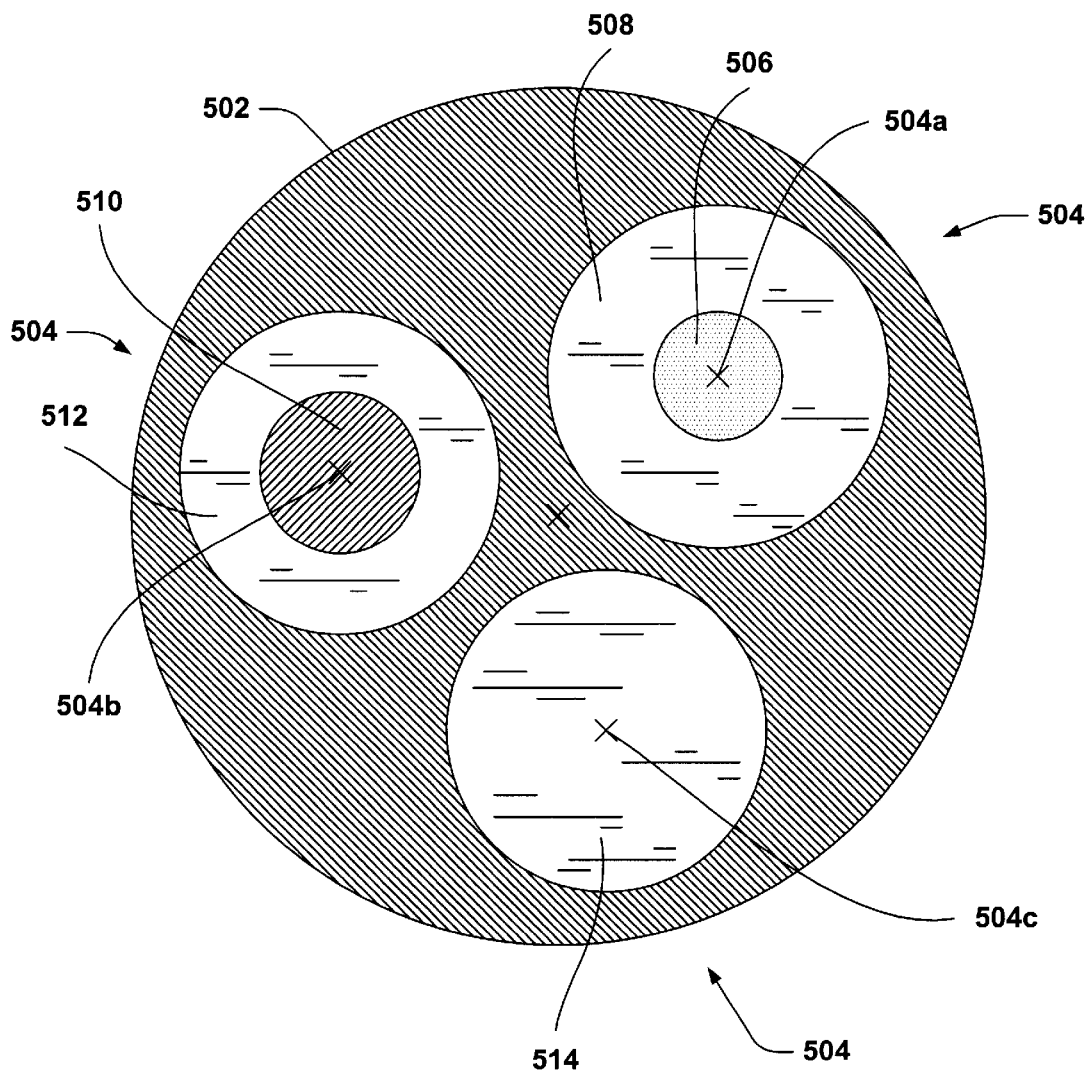
FIG. 16 is a plan view of an exemplary illumination scheme modification device having a plurality of pupil filters thereon according to the present invention.

FIG. 15 illustrates an exemplary, simplified perspective view of a projection-type lithography system 500 incorporating an illumination modification filter 502 according to the present invention. The illumination modification filter 502 preferably includes a plurality of distinct illumination filtering zones, wherein each zone is operable to provide a distinct and unique illumination scheme. A simplified exemplary filter 502 having only three such illumination modification zones 504 is illustrated in FIG. 16.

A first zone 504a in the filter 502 illustrates an exemplary pupil filter which inverts or otherwise varies the phase of light which passes through a central, circular region 506 with respect to the phase of the light which passes through an annular region 508 surrounding the inner, circular region 506. As is well known by those skilled in the art, such a phase inversion may be provided in either a continuous or step-wise fashion. In addition, as is well known by those skilled in the art, such a pupil filter 504a may be constructed by forming a transparent dielectric film over the central region 506, wherein the thickness of the film may be controlled to provide the desired phase variation.

A second zone 504b in the filter 502 illustrates another exemplary pupil filter, wherein an inner region 510 exhibits a lower transmittance than an outer, annular region 512 via a light-absorbing layer formed in the inner region 510. The transmittance may be modified further by adjusting a radius of the inner region 510 as well as its degree of transmittance. In so doing, a wide variation of illumination schemes may be effectuated therewith. As is well known by those skilled in the art, such a variable transmittance pupil filter 504b may be formed by forming a light-absorbing material, such as a metal film, over the central region 510, wherein a thickness of the material may be controlled to vary its transmittance.

The last zone 504c illustrates an exemplary uniform illumination pupil filter. Such a pupil filter is operable to allow all or some of the illumination light to transmit therethrough in a uniform fashion. Such a filter 504c may be constructed with a uniform, transparent plate 514 or alternatively may have a uniform light-absorbing material thereon having a thickness which provides for a uniform illumination attenuation. Although three exemplary pupil filters are illustrated in FIG. 16 and discussed above, other type pupil filters may be utilized and are contemplated as falling within the scope of the present invention. In addition, the various functions described above, such as phase variation or transmittance attenuation, may be combined as may be desired. In addition, although the filter 502 of FIG. 16 is shown with only three filtering zones 504, the filter will preferably include a substantially greater number of zones, for example, a number equal to the number of points 218 on the substrate so that each point may have its own custom illumination zone which may be modified with respect to neighboring zones.

In the above manner, the present invention provides for a custom illumination scheme across the image field which provides illumination compensation to thereby compensate for imaging system aberrations. Consequently, the uniformity of critical dimensions of features is improved across the substrate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of extracting effective imaging system aberrations from test data collected from test structures constructed from a lithography system having an imaging system associated therewith, comprising the steps of:

inputting experimental critical dimension data to an intelligent system, wherein the experimental critical dimension data corresponds to fabricated features on a substrate at a plurality of points in an image field of the imaging system;

inputting nominal critical dimension data to the intelligent system, wherein the nominal critical dimension data corresponds to the fabricated features on the substrate at a plurality of points in an image field of the imaging system; and determining the effective aberrations across the image field of the imaging system associated with the lithography system used to fabricate the features using the intelligent system.

2. The method of claim 1, wherein the intelligent system comprises one of a neural network and an expert system.

3. The method of claim 1, wherein the experimental critical dimension data is collected by measuring the fabricated features on the substrate using one of an electrical linewidth measurement technique, an optical measurement technique and a scanning electron microscope.

4. The method of claim 1, wherein the experimental critical dimension data represents fabricated features at a plurality of points across the substrate which correspond to a plurality of points in an image field of the imaging system.

5. The method of claim 1, wherein the fabricated features comprise an array of features which are duplicated at a plurality of points across the substrate.

6. The method of claim 1, wherein the intelligent system comprises a calibrated neural network and wherein calibrating the neural network comprises the steps of:

(a) inputting an imaging system aberration condition to a lithography simulator;

(b) performing a lithography simulation for a plurality of input features representing a set of nominal critical dimensions at a fixed set of lithography process conditions and at the imaging system aberration condition;

(c) saving an output of the lithography simulation of step (b) in a memory, wherein the output comprises a plurality of simulated features corresponding to the input features having critical dimensions that differ from the nominal critical dimensions due to the aberration condition;

(d) inputting another imaging system aberration condition to the lithography simulator; and (e) repeating steps (b), (c) and (d) a predetermined number of times, thereby generating and saving in the memory a training set of data representing critical dimensions of simulated features corresponding to the input features at a plurality of imaging system aberration conditions.

7. A method of extracting effective imaging system aberrations from test data collected from test structures constructed from a lithography system having an imaging system associated therewith, comprising the steps of:

inputting experimental critical dimension data corresponding to fabricated features on a substrate to an intelligent system;

inputting nominal critical dimension data corresponding to the fabricated features on the substrate to the intelligent system; and determining the effective aberrations of the imaging system associated with the lithography system used to fabricate the features using a calibrated neural network, and wherein calibrating the neural network comprises the steps of:

(a) inputting an imaging system aberration condition to a lithography simulator;

(b) performing a lithography simulation for a plurality of input features representing a set of nominal critical dimensions at a fixed set of lithography process conditions and at the imaging system aberration condition:

(c) saving an output of the lithography simulation of step (b) in a memory, wherein the output comprises a plurality of simulated features corresponding to the input features having critical dimensions that differ from the nominal critical dimensions due to the aberration condition;

(d) inputting another imaging system aberration condition to the lithography simulator; and (e) repeating steps (b), (c) and (d) a predetermined number of times, thereby generating and saving in the memory a training set of data representing critical dimensions of simulated features corresponding to the input features at a plurality of imaging system aberration conditions;

(f) inputting the simulated features to the neural network;

(g) inputting the input features to the neural network;

(h) comparing an output of the neural network, which represents an imaging system aberration condition, with an expected imaging system aberration condition using the training set;

(i) adjusting one or more interconnections of nodes within the neural network in response to the comparison; and (j) repeating steps (h) and (i) until the output is within a predetermined amount of the expected imaging system aberration condition.

8. The method of claim 7, wherein adjusting the one or more interconnections comprises adjusting a weight of the one or more interconnections of nodes within the neural network.

9. The method of claim 8, wherein the adjustment of the weight of the one or more interconnections of nodes is based on a Levenberg-Marquardt training algorithm.

10. A system for characterizing an imaging system for a projection-type photolithography system, comprising:

a lithography simulator, wherein the lithography simulator is operable to simulate a lithography process step for one or more nominal features based on a set of lithography process conditions and one or more imaging system aberration conditions, and wherein the lithography simulator outputs one or more simulated features which vary with respect to the nominal features due to the imaging system aberration conditions;

a first memory operatively coupled to the lithography simulator, wherein the memory stores input data and output data associated with one or more lithography simulations performed by the lithography simulator;

a second memory which stores experimental test feature critical dimension data for one or more experimental test features which were formed using the imaging system being characterized; and an intelligent system operatively coupled to the first memory and the second memory, wherein the intelligent system receives the input data and the output data associated with the one or more lithography simulations and the experimental test feature critical dimension data and determines an effective imaging system aberration condition at one or more points in response thereto.

11. The system of claim 10, wherein the first memory and the second memory are different memories.

12. The system of claim 10, wherein the intelligent system comprises an expert system.

13. The system of claim 10, wherein the intelligent system comprises a neural network.

14. A system for characterizing an imaging system for a projection-type photolithography system, comprising:

a lithography simulator, wherein the lithography simulator is operable to simulate a lithography process step for one or more nominal features based on a set of lithography process conditions and one or more imaging system aberration conditions, and wherein the lithography simulator outputs one or more simulated features which vary with respect to the nominal features due to the imaging system aberration conditions;

a first memory operatively coupled to the lithography simulator, wherein the memory stores input data and output data associated with one or more lithography simulations performed by the lithography simulator;

a second memory which stores experimental test feature critical dimension data for one or more experimental test features which were formed using the imaging system being characterized; and an expert system operatively coupled to the first memory and the second memory, wherein the intelligent system receives the input data and the output data associated with the one or more lithography simulations and the experimental test feature critical dimension data and determines an effective imaging system aberration condition at one or more points in response thereto, wherein the expert system contains a plurality of expert rules which are applied to the input data, output data and the experimental test feature critical dimension data to determine the effective imaging system aberration condition at the one or more points.

15. A system for characterizing an imaging system for a projection-type photolithography system, comprising:

a lithography simulator, wherein the lithography simulator is operable to simulate a lithography process step for one or more nominal features based on a set of lithography process conditions and one or more imaging system aberration conditions, and wherein the lithography simulator outputs one or more simulated features which vary with respect to the nominal features due to the imaging system aberration conditions;

a first memory operatively coupled to the lithography simulator, wherein the memory stores input data and output data associated with one or more lithography simulations performed by the lithography simulator;

a second memory which stores experimental test feature critical dimension data for one or more experimental test features which were formed using the imaging system being characterized; and a neural network operatively coupled to the first memory and the second memory, wherein the intelligent system receives the input data and the output data associated with the one or more lithography simulations and the experimental test feature critical dimension data and determines an effective imaging system aberration condition at one or more points in response thereto, and wherein the intelligent system comprises a neural network, wherein the neural network uses the input data and the output data associated with the one or more lithography simulations as a training set to calibrate the neural network and thereby establish a transfer function which maps a deviation between one or more nominal features and the one or more experimental test features to an imaging system aberration condition which could have produced such deviation.

16. The system of claim 15, wherein the calibrated neural network uses the experimental test feature critical dimension data and data related to one or more nominal features which correspond to the experimental test features to determine the imaging system aberration condition at the one or more points.

* * * * *

UNITED STATES PATENT AND TRADEMARK OFFICE
CERTIFICATE OF CORRECTION

PATENT NO.   : 6,272,392 B1
DATED        : August 7, 2001
INVENTOR(S)  : Luigi Capodieci It is certified that error appears in the above-identified patent and that said Letters Patent is hereby corrected as shown below:

Column 8,
Line 44, please replace "$(X_1,X_{y1}), (X_2, Y_2), \ldots (X_1, Y_1)$" with -- $(X_1, Y_1), (X_2, Y_1), \ldots (X_i, Y_j)$ --.

Column 9,
Line 64, please replace "$(\overline{CD},$" with -- $\overline{CD}_1,$ --.

Column 10,
Line 3, please replace "$\overline{CD}_1=CD,\pm\Delta CD_1)$" with -- $\overline{CD}_1=CD_1\pm\Delta CD_1)$ --.
Line 27, please replace "$(CD,,$" with -- $(CD_1,$ --.

Column 12,
Line 20, please replace "$(Z_2,X_2,Y_1), \ldots (Z_1,X_1,Y_1); \ldots (Z_1,X_1,Y_j),(Z_1,X_1,Y_1)\ldots$" with -- $(Z_2,X_2,Y_1), \ldots (Z_p,X_2,Y_1); \ldots (Z_1,X_i,Y_j),(Z_2,X_i,Y_j)\ldots$ --.
Line 21, please replace "$(Z_p,X_1Y_1)))$" with -- $(Z_p,X_i,Y_j)))$ --.

Column 13,
Line 9, please replace "$\underline{Y_1}), \overline{CD}_2(X_1,Y_1), \ldots \overline{CD}_n(X_1, \ldots Y_1; \ldots \overline{CD}_1(X_1,Y_1),\overline{CD}_2$" with -- $Y_1), \overline{CD}_2(X_1,Y_1), \ldots \overline{CD}_n(X_1,Y_1); \ldots \overline{CD}_1(X_i,T_j)\,CD_2$ --.
Line 10, please replace "$(X_1,Y_j)$" with -- $(X_i,Y_j)$ --.

Signed and Sealed this

Fifteenth Day of January, 2002

Attest:

JAMES E. ROGAN
*Director of the United States Patent and Trademark Office*

*Attesting Officer*